(12) United States Patent
Peng et al.

(10) Patent No.: US 12,433,034 B2
(45) Date of Patent: Sep. 30, 2025

(54) INTEGRATED CIRCUIT DEVICE AND METHOD FOR ESD PROTECTION

(71) Applicant: TAIWAN SEMICONDUCTOR MANUFACTURING COMPANY, LTD., Hsinchu (TW)

(72) Inventors: Po-Lin Peng, Hsinchu (TW); Yu-Ti Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1224 days.

(21) Appl. No.: 17/214,110

(22) Filed: Mar. 26, 2021

(65) Prior Publication Data

US 2022/0310589 A1 Sep. 29, 2022

(51) Int. Cl.
  *H10D 89/60* (2025.01)
  *H02H 9/04* (2006.01)
(52) U.S. Cl.
  CPC .......... *H10D 89/713* (2025.01); *H02H 9/046* (2013.01); *H10D 89/813* (2025.01)
(58) Field of Classification Search
  None
  See application file for complete search history.

(56) References Cited

U.S. PATENT DOCUMENTS

| | | | |
|---|---|---|---|
| 11,159,014 B2* | 10/2021 | Ille | H02H 9/046 |
| 2007/0159754 A1* | 7/2007 | Huang | H01L 27/0255 |
| | | | 361/111 |
| 2008/0218920 A1* | 9/2008 | Vanysacker | H01L 27/0251 |
| | | | 361/56 |
| 2014/0284720 A1* | 9/2014 | Chen | H01L 29/0847 |
| | | | 257/355 |
| 2019/0296545 A1* | 9/2019 | Rouviere | H02H 9/04 |
| 2020/0014200 A1* | 1/2020 | Peng | H01L 27/0251 |
| 2022/0216693 A1* | 7/2022 | Xu | H10D 89/713 |

* cited by examiner

*Primary Examiner* — Nilufa Rahim
(74) *Attorney, Agent, or Firm* — Hauptman Ham, LLP

(57) ABSTRACT

An IC device includes a first power terminal, an IO pad, a first ESD protection device coupled between the first power terminal and IO pad, a first trigger current source device coupled between the first power terminal and IO pad, and a semiconductor substrate over which the first ESD protection device and first trigger current source device are formed. The first ESD protection device includes a parasitic BJT having a collector and an emitter coupled between the IO pad and first power terminal, and a base coupled via a substrate resistance to a well tap coupled to the first power terminal. The first trigger current source device, in response to an ESD voltage on the IO pad, becomes conductive and causes discharge of the ESD voltage through the first ESD protection device to the first power terminal.

20 Claims, 18 Drawing Sheets

INTEGRATED CIRCUIT DEVICE AND METHOD FOR ESD PROTECTION

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
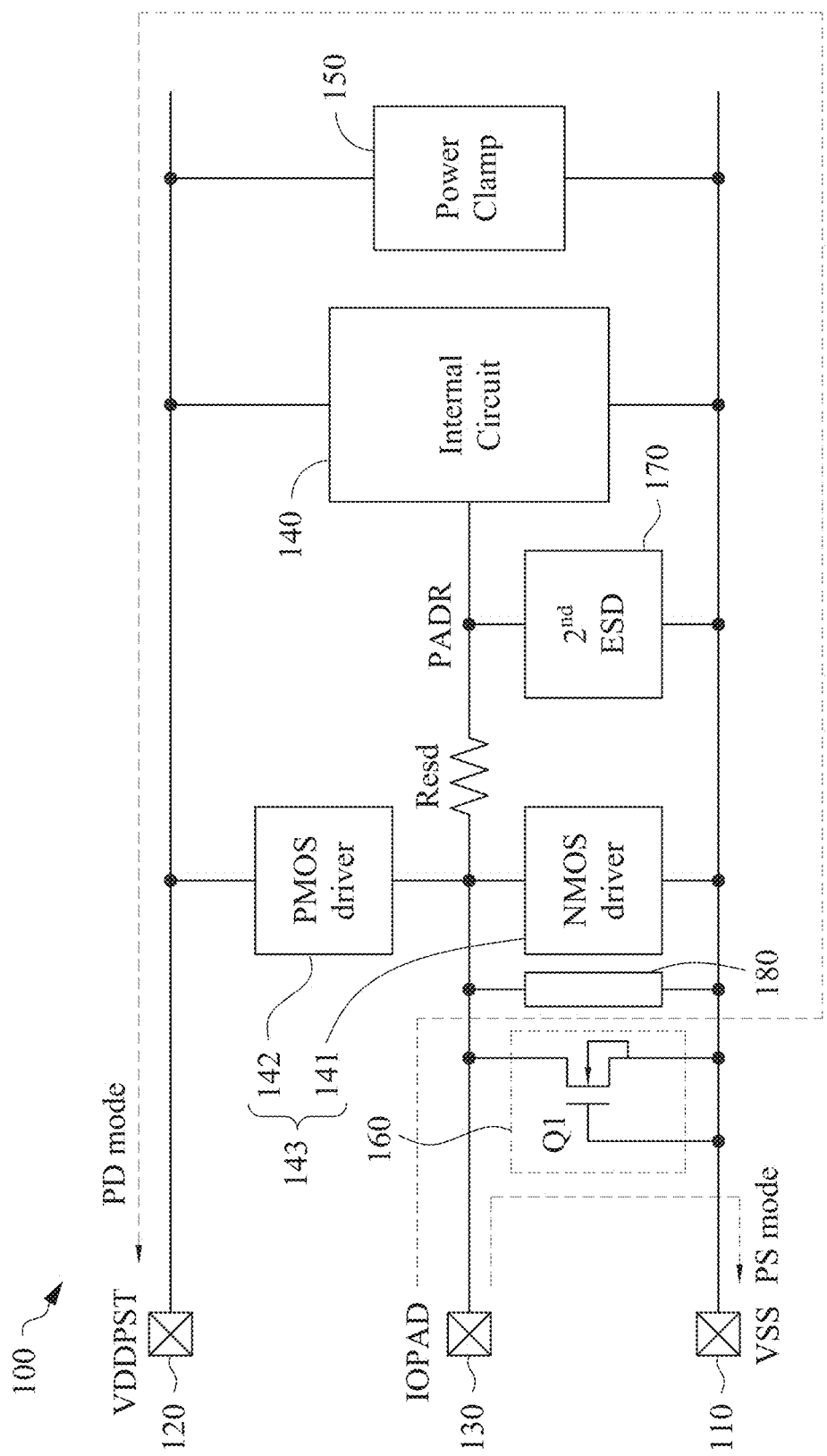
FIG. 1 is a schematic block diagram of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A parameter to be considered in an ESD protection device is an ESD trigger voltage at which the ESD protection device is turned ON, i.e., becomes conductive, to discharge high and harmful voltage and/or current of an ESD event away from circuits to be protected. A high ESD trigger voltage is potentially harmful to the circuits to be protected, and/or potentially causes non-uniform turning ON and/or early failure of the ESD protection device itself. In some embodiments, to reduce the ESD trigger voltage, a trigger current source device is included in a semiconductor substrate of the ESD protection device to inject a substrate current into the semiconductor substrate when an ESD event occurs. The injected substrate current increases a base-emitter voltage of a parasitic bipolar junction transistor (BJT) of the ESD protection device, and causes the ESD protection device to turn ON at a lower ESD voltage than when the trigger current source device is not provided. In other words, the ESD trigger voltage is lowered. Compared to other approaches, at least one embodiment advantageously provides a design technology co-optimization solution for lowering the ESD trigger voltage without complicating and/or adding manufacturing processes.

FIG. 1 is a schematic block diagram of an IC device 100 in accordance with some embodiments.

The IC device 100 includes a first power supply voltage terminal 110, a second power supply voltage terminal 120, an input/output (IO) pad 130, an internal circuit 140, an n-channel metal-oxide semiconductor (NMOS) driver 141, a p-channel metal-oxide semiconductor (PMOS) driver 142, a power clamp 150, a first ESD protection device 160, a second ESD protection device 170, and a trigger current source device 180. In some embodiments, the IC device 100 is incorporated in a single IC, or on a single semiconductor substrate. In some embodiments, the IC device 100 includes one or more ICs on one or more single semiconductor substrates.

The first power supply voltage terminal 110 is configured to receive a first power supply voltage for normal operation of the internal circuit 140, and the second power supply voltage terminal 120 is configured to receive a second power supply voltage for the normal operation of the internal circuit 140. The first power supply voltage terminal 110 or the second power supply voltage terminal 120 is also referred to as a power supply voltage bus or rail. In the example configuration in FIG. 1, the first power supply voltage is a ground voltage, the first power supply voltage terminal 110 is a ground voltage terminal, the second power supply voltage is a positive power supply voltage, and the second power supply voltage terminal 120 is a positive voltage terminal. Other power supply arrangements are within the scopes of various embodiments. In the description herein, the first power supply voltage terminal 110 is referred to as VSS, whereas the second power supply voltage terminal 120 is referred to as VDDPST (post-driver VDD) or VDD.

The IO pad 130 (hereinafter "IOPAD") is a node, bus or pin which is coupled to the internal circuit 140 and via which a signal is input into or output from the internal circuit 140. In the example configuration in FIG. 1, IOPAD 130 is coupled to the internal circuit 140 via a current limiting resistor Resd (hereinafter "Resd") and an intermediate node PADR (hereinafter "PADR"). In at least one embodiment, Resd is omitted, and IOPAD 130 is directly coupled to the internal circuit 140.

The internal circuit 140 is coupled to VDD and VSS, and comprises circuitry configured to generate or process the signal to be output or input via IOPAD. In an example, the internal circuit 140 comprises core circuitry configured to operate at a voltage level lower than the voltage level of VDD. The NMOS driver 141 is coupled between IOPAD and VSS, and the PMOS driver 142 is coupled between IOPAD and VDD. The NMOS driver 141 and the PMOS driver 142 are configured to operate, in cooperation, as a driver circuit 143 to handle signal transfer between the lower voltage level of the core circuitry and the higher voltage level of VDD. In at least one embodiment, the NMOS driver 141 comprises an NMOS transistor and the PMOS driver 142 comprises a PMOS transistor. In at least one embodiment, the NMOS driver 141 and PMOS driver 142 are omitted.

The power clamp 150 is coupled between VDD and VSS. The power clamp 150 is a normally nonconductive device or circuit which is nonconductive, or turned OFF, during the normal operation of the internal circuit 140. Specifically, the power clamp 150 is nonconductive when the voltage difference between VDD and VSS is within a predetermined range, e.g., around a nominal voltage level of VDD with VSS having the ground voltage. When the voltage difference across the power clamp 150 is equal to or greater than a threshold voltage of the power clamp 150, the power clamp 150 is turned ON to conduct the current between VDD and VSS.

The first ESD protection device 160 is coupled between IOPAD and VSS, and is configured to protect the internal circuit 140 and/or the driver circuit 143 in an ESD event, without affecting the normal operation of the internal circuit 140 and/or the driver circuit 143. In other words, the first ESD protection device 160 is turned OFF or non-conductive in the absence of an ESD event. An ESD event occurs when an ESD voltage or current higher than a level of voltage or current expected during the normal operation of the internal circuit 140 is applied to IOPAD 130. Without the first ESD protection device 160, such an ESD event causes excessive and potentially damaging voltages or currents in the internal circuit 140 and/or the driver circuit 143. For example, in a Positive-to-VSS (PS) mode, a positive ESD voltage is applied to IOPAD 130 when VSS is grounded and VDD is floating. When the ESD voltage is higher than an ESD trigger voltage of the first ESD protection device 160, the first ESD protection device 160 is turned ON and discharge the ESD voltage on IOPAD 130 through the turned ON first ESD protection device 160 to VSS, as shown by arrow "PS Mode" in FIG. 1. For another example, in a Positive-to-VDD (PD) mode, a positive ESD voltage is applied to IOPAD 130 when VDD is grounded and VSS is floating. When the ESD voltage is higher than the ESD trigger voltage of the first ESD protection device 160, the first ESD protection device 160 is turned ON and causes a voltage surge on VSS. As a result, an excess voltage difference occurs across the power clamp 150. When the excess voltage difference is equal to or greater than the threshold voltage of the power clamp 150, the power clamp 150 becomes conductive and the ESD voltage on IOPAD is discharged through the turned ON first ESD protection device 160, to VSS, then through the turned ON power clamp 150, to VDD, as shown by arrow "PD Mode" in FIG. 1. In either PS mode or PD mode, the internal circuit 140 and/or the driver circuit 143 is/are protected from the high and potentially harmful ESD voltage on IOPAD. Examples of the first ESD protection device 160 include, but are not limited to, a snapback device having a parasitic NPN BJT, a snapback MOS device, a field oxide device (FOD), a silicon-controlled-rectifier (SCR), or the like. In the example configuration in FIG. 1, the first ESD protection device 160 comprises a drain-extended NMOS (DENMOS) Q1 having a grounded gate coupled to VSS. A detailed description of Q1 is given herein with respect to FIG. 3.

The second ESD protection device 170 is coupled between PADR and VSS, and is coupled to IOPAD 130 via Resd. The second ESD protection device 170 is also configured to protect the internal circuit 140 and/or the driver circuit 143 in an ESD event. In at least one embodiment, the second ESD protection device 170 is configured similarly to the first ESD protection device 160, but with a smaller size and/or a lower ESD trigger voltage. Specifically, to provide sufficient ESD protection for the internal circuit 140 and/or the driver circuit 143, the first ESD protection device 160 in some situations has a large size to sink large ESD current and/or discharge high ESD voltage. With such a large size, the first ESD protection device 160 is potentially slow to turn ON. The second ESD protection device 170 is configured to temporarily limit the voltage applied via PADR to the internal circuit 140 until the first ESD protection device 160 is turned ON. For this purpose, the second ESD protection device 170 is configured to have a smaller size and a lower ESD trigger voltage than the first ESD protection device 160. When an ESD event occurs, the second ESD protection device 170 with the lower ESD trigger voltage is turned ON first, and limits the voltage applied at PADR to the internal circuit 140. The first ESD protection device 160 with the higher ESD trigger voltage is turned ON next to discharge the high ESD voltage as described herein. In at least one embodiment, the first ESD protection device 160 is configured to turn ON before thermal breakdown of the second ESD protection device 170 which, with the smaller size, is not potentially sufficient to sustain high ESD voltage or ESD current for a long period of time. Examples of the second ESD protection device 170 include, but are not limited to, a snapback device having a parasitic NPN BJT, a snapback MOS device, a field oxide device (FOD), a silicon-controlled-rectifier (SCR), or the like.

Resd is a current limiting resistor coupled between IOPAD 130 and PADR where the internal circuit 140 and the second ESD protection device 170 are coupled. Resd is configured to limit the current following via PADR into the internal circuit 140, and also to partially limit the ESD voltage apply via PADR to the second ESD protection device 170 to lower the likelihood of the second ESD protection device 170 being damaged in an ESD event. In at least one embodiment, the second ESD protection device 170 and/or Resd is/are omitted.

The trigger current source device 180 is coupled between IOPAD 130 and VSS. As described herein, the first ESD protection device 160 in some embodiments has a large size to sustain and discharge high ESD voltage or current. Such a large size is associated with a high ESD trigger voltage. The trigger current source device 180 is configured to lower the ESD trigger voltage of the first ESD protection device 160, as described herein.

Figure 2:
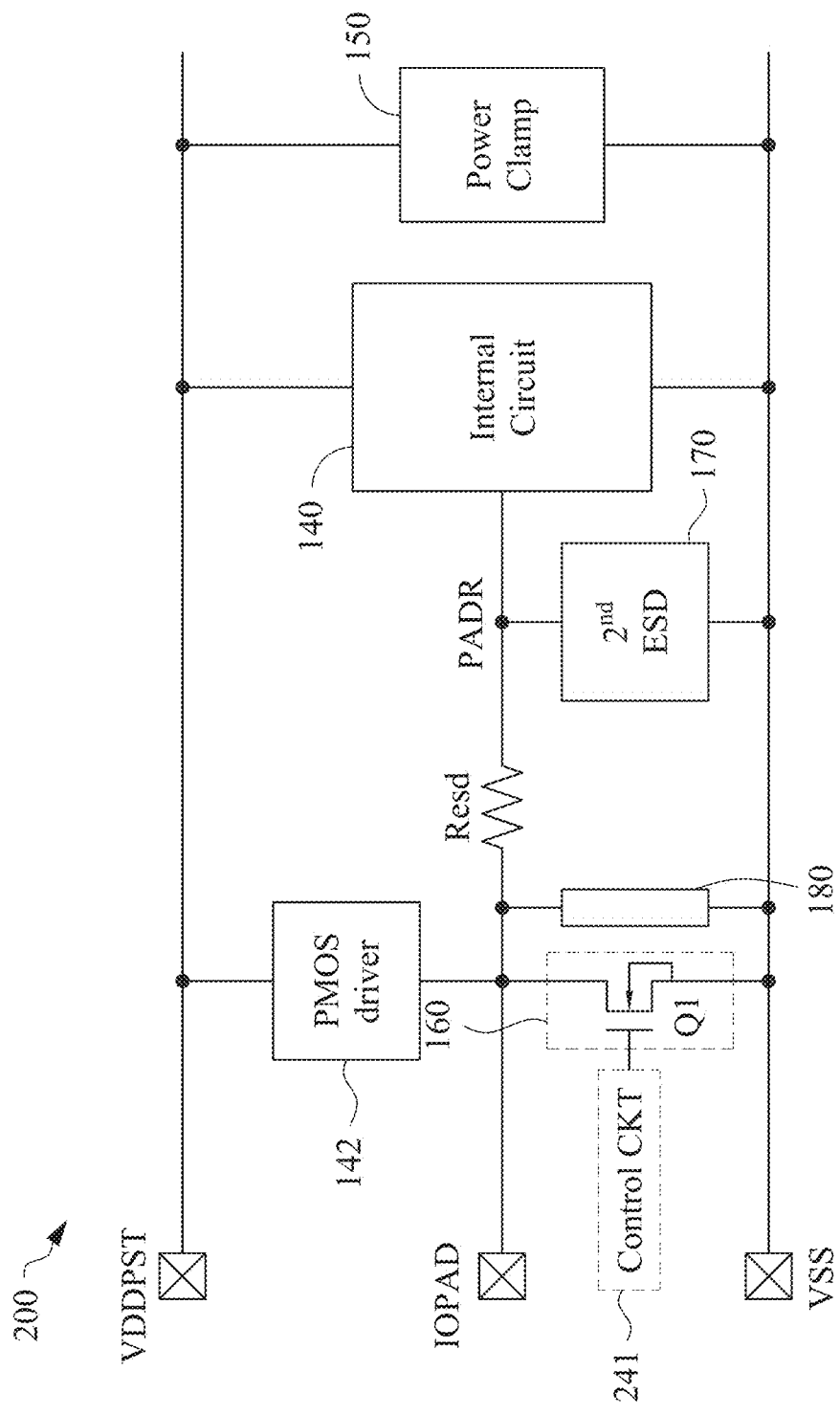
FIG. 2 is a schematic block diagram of an IC device, in accordance with some embodiments.

FIG. 2 is a schematic block diagram of an IC device 200 in accordance with some embodiments.

Compared to the IC device 100, the IC device 200 comprises a control circuit (Control CKT) 241, and Q1 in the IC device 200 is configured to function as both the first ESD protection device 160 and the NMOS driver 141. For this purpose, the gate of Q1 is not coupled to VSS as in the IC device 100; instead, the gate of Q1 is coupled to the control circuit 241. In the absence of an ESD event, Q1 is configured to, under control of the control circuit 241, operate in cooperation with the PMOS driver 142 as a driver circuit during the normal operation of the internal circuit 140. When an ESD event occurs, Q1 is configured to operate as an ESD protection device as described with respect to FIGS. 1 and 3.

Figure 3:
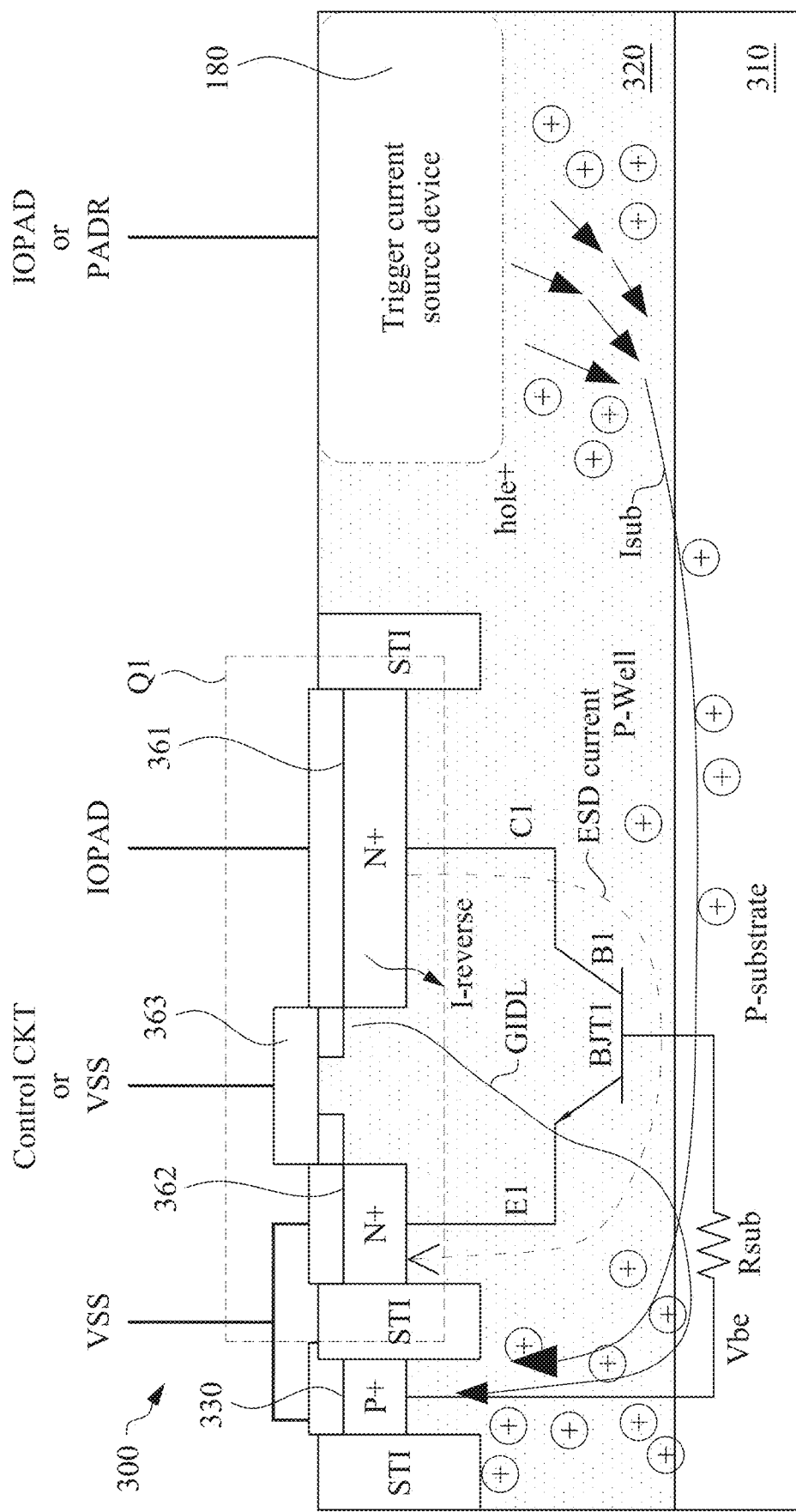
FIG. 3 is a schematic cross-sectional view combined with a schematic electric diagram of an IC device, in accordance with some embodiments.

FIG. 3 is a schematic cross-sectional view of an IC device 300, in accordance with some embodiments. The IC device 300 corresponds to a portion including Q1 and the trigger current source device 180 of the IC device 100 or the IC device 200. The cross-sectional view in FIG. 3 is also combined with a schematic electric diagram of the IC device 300.

The IC device 300 comprises a semiconductor substrate 310. In the example configuration in FIG. 3, the semiconductor substrate 310 is a P substrate. The P substrate 310 has therein a P well 320. A P well tap 330 is formed over the P well 320 and coupled to VSS. Q1 is formed over the P well 320, and comprises a drain region 361, a source region 362, and a gate region 363. The drain region 361 and the source region 362 are N active regions having N dopants implanted in the P well 320. The drain region 361 is coupled to IOPAD, and the source region 362 is coupled to VSS. In some embodiments, the drain region 361 and the source region 362 comprise fins in accordance with fin field-effect transistor (FinFET) complementary metal-oxide-semiconductor (CMOS) technologies. In some embodiments, the drain region 361 and the source region 362 are free of fins in accordance with planar CMOS technologies. The drain region 361 is an extended drain region and has a greater size than the source region 362. In at least one embodiment, a silicide layer (not shown) covers a portion, but not the entirety, of the drain region 361. Such a partially silicided configuration of the drain region 361 improves self-protection of Q1 from ESD events. In at least one embodiment, the drain region 361 is fully silicided. The gate region 363 is arranged between the drain region 361 and the source region 362, and comprises a conductive material such as metal or polysilicon (also referred to herein as "poly"). The gate region 363 is either coupled to VSS as described with respect to FIG. 1, or to a control circuit as described with respect to FIG. 2. The trigger current source device 180 is formed over the P well 320. The trigger current source device 180 is coupled to IOPAD as described with respect to FIGS. 1-2, or to PADR as described with respect to other figures below. A plurality of isolation regions STI are formed over the P well 320 to isolate various active regions from each other.

The schematic electric diagram of the IC device 300 in FIG. 3 shows a parasitic transistor BJT1 and a resistor Rsub. BJT1 is an NPN BJT formed by the formation of the N drain region 361 and the N source region 362 in the P well 320 and the P substrate 310. The drain region 361 of Q1 corresponds to a collector C1 of BJT1, the source region 362 of Q1 corresponds to an emitter E1 of BJT1, and the P well 320 and P substrate 310 correspond to a base B1 of BJT1. In other words, the collector C1 and the emitter E1 are coupled between the IOPAD and VSS. Rsub represents substrate resistance of the P substrate 310 and/or the P well 320 between the base B1 and the P well tap 330. A voltage drop across Rsub corresponds to a base-emitter voltage Vbe between the base B1 and the emitter E1 of BJT1.

In the absence of an ESD event, Vbe of BJT1 is lower than a threshold voltage of BJT1. For example, Vbe is zero. As a result, BJT1 is turned OFF. When the gate region 363 of Q1 is coupled to VSS as described with respect to FIG. 1, Q1 is also turned OFF without affecting the normal operation of the internal circuit 140. When the gate region 363 of Q1 is coupled to a control circuit as described with respect to FIG. 2, Q1 is turned ON or OFF under control of the control circuit to controllably pull IOPAD to VSS during the normal operation of the internal circuit 140. The trigger current source device 180 is configured to turn OFF, or remains non-conductive, during the normal operation of the internal circuit 140.

In an ESD event, an ESD voltage is applied to IOPAD. The ESD voltage on IOPAD is much higher than the voltage of the gate region 363, a gate-induced-drain-leakage (GIDL) is generated to flow from the gate region 363 to the P well tap 330. At the same time, the PN junction between the N drain region 361 and the P well 320 is reverse biased until avalanche breakdown occurs, causing an N+/P well reverse leakage (I-reverse) to flow from the drain region 361 to the P well tap 330. The trigger current source device 180 is coupled to IOPAD to receive the ESD voltage, or coupled to PADR to receive a part of the ESD voltage as limited by Resd. In either case, the trigger current source device 180 is configured to, in response to the ESD voltage applied to IOPAD, become conductive and cause discharge of the ESD voltage on IOPAD through the first ESD protection device 160 to VSS. For example, the trigger current source device 180 becomes conductive and injects a substrate current Isub into the P substrate 310 and/or the P well 320. The GIDL and I-reverse leakages and Isub injected by the trigger current source device 180 all include positively charged holes that flow across the P well 320 and/or the P substrate 310 to be collected by the P well tap 330. The flow of positively charged holes cause a voltage drop across Rsub. This voltage drop corresponds to Vbe. The higher the ESD voltage on IOPAD, the higher the Vbe. When Vbe reaches the threshold voltage of BJT1, BJT1 is turned ON and causes an ESD current to flow from the drain region 361 to the source region 362. As a result, the ESD voltage on IOPAD is discharged through the turned ON BJT1 to VSS. The ESD voltage at which Vbe reaches the threshold voltage of BJT1 is an ESD trigger voltage of Q1 or the first ESD protection device 160.

In other approaches without the trigger current source device 180, a flow of positively charged holes in an ESD event is created by GIDL and I-reverse leakages, without positively charged holes contributed by Isub. As a result, at the same ESD voltage, Vbe in the other approaches is lower than in embodiments where the trigger current source device 180 is included. In other words, embodiments including the trigger current source device 180 permit Vbe to reach the threshold voltage of BJT1 at a lower ESD voltage, and therefore, have a lower ESD trigger voltage than the other approaches. In at least one embodiment, the lower ESD trigger voltage advantageously avoids one or more issues associated with a higher ESD trigger voltage in other approaches, including, but not limited to, potential damage to the circuits to be protected, non-uniform turning ON, early failure of the ESD protection device itself.

Figure 4A:
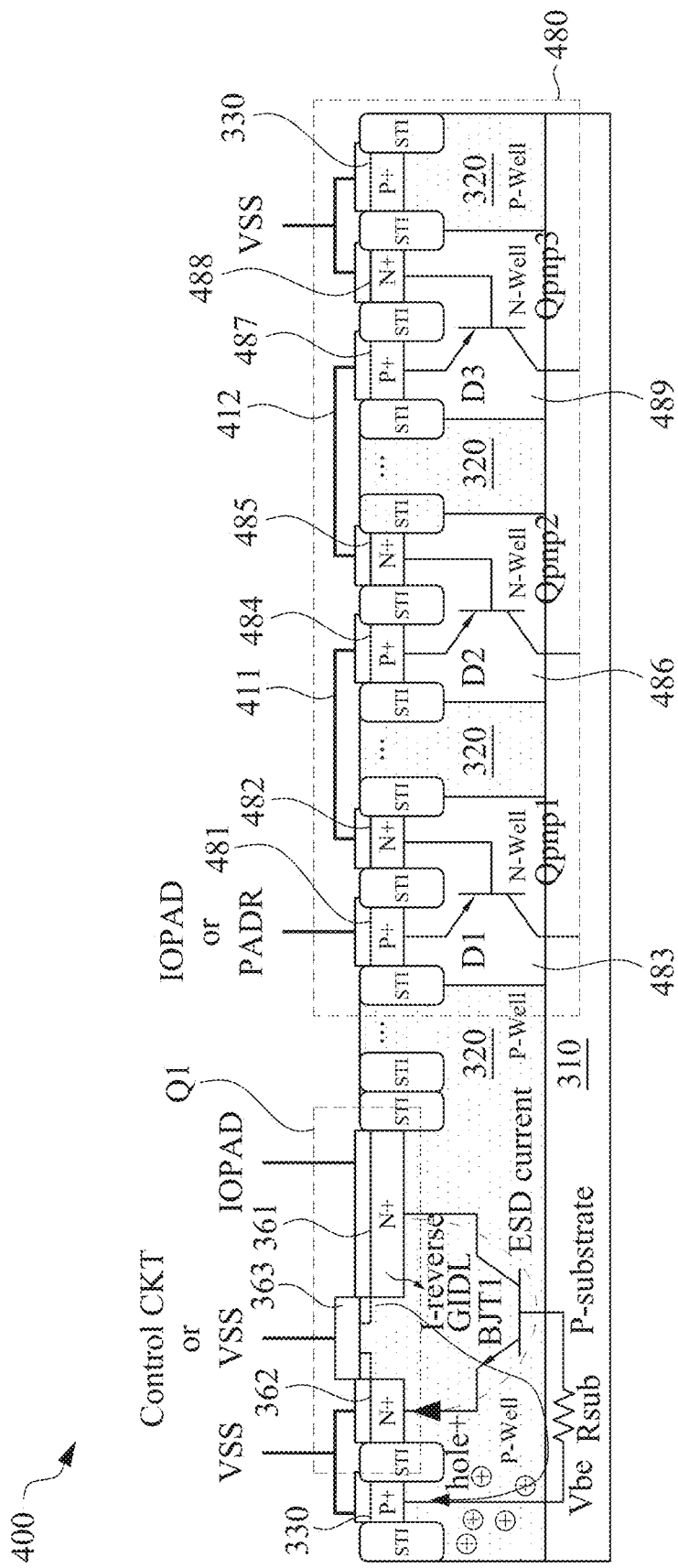
FIG. 4A is a schematic cross-sectional view combined with a schematic electric diagram of an IC device, in accordance with some embodiments.

FIG. 4A is a view similar to FIG. 3 and shows an IC device 400, in accordance with some embodiments. Compared to the IC device 300, the IC device 400 comprises a trigger current source device 480 corresponding to the trigger current source device 180.

The trigger current source device 480 comprises a series of serially coupled diodes D1, D2, D3. In the example configuration in FIG. 4A, each diode D1, D2, D3 is a P diode. For example, D1 comprises an anode 481 comprising a P active region, and a cathode 482 comprising an N active region. The anode 481 and the cathode 482 are formed over an N well 483 in the P well 320. D2 comprises an anode 484 comprising a P active region, and a cathode 485 comprising an N active region. The anode 484 and the cathode 485 are formed over an N well 486 in the P well 320. D3 comprises an anode 487 comprising a P active region, and a cathode 488 comprising an N active region. The anode 487 and the cathode 488 are formed over an N well 489 in the P well 320.

The diodes D1, D2, D3 are serially coupled into a series, so that a cathode of a preceding diode is coupled by a conductive pattern to an anode of a subsequent diode. For example, the cathode 482 of D1, which is the first diode in the series, is coupled by a conductive pattern 411 to the anode 484 of D2 which is the diode subsequent to D1 in the series. The cathode 485 of D2 is coupled by a conductive pattern 412 to the anode 487 of D3 which is the diode subsequent to D2 in the series and is also the last diode in the series. The anode 481 of the first diode D1 corresponds to a first end of the series and is coupled to IOPAD or PADR. The cathode 488 of the last diode D3 corresponds to a second end of the series and is coupled to VSS.

A schematic electric diagram of the IC device 400 in FIG. 4A shows parasitic transistors Qpnp1, Qpnp2, Qpnp3 corresponding to diodes D1, D2, D3, respectively. Qpnp1 is a PNP BJT formed by the formation of the P active region of the anode 481 in the corresponding N well 483 over the P substrate 310. The P active region of the anode 481 corresponds to an emitter of Qpnp1, the N well 483 corresponds to a base of Qpnp1, and the P substrate 310 corresponds to a collector of Qpnp1. Qpnp2 is a PNP BJT formed by the formation of the P active region of the anode 484 in the corresponding N well 486 over the P substrate 310. The P active region of the anode 484 corresponds to an emitter of Qpnp2, the N well 486 corresponds to a base of Qpnp2, and the P substrate 310 corresponds to a collector of Qpnp2. Qpnp3 is a PNP BJT formed by the formation of the P active region of the anode 487 in the corresponding N well 489 over the P substrate 310. The P active region of the anode 487 corresponds to an emitter of Qpnp3, the N well 489 corresponds to a base of Qpnp3, and the P substrate 310 corresponds to a collector of Qpnp3.

Figure 4B:
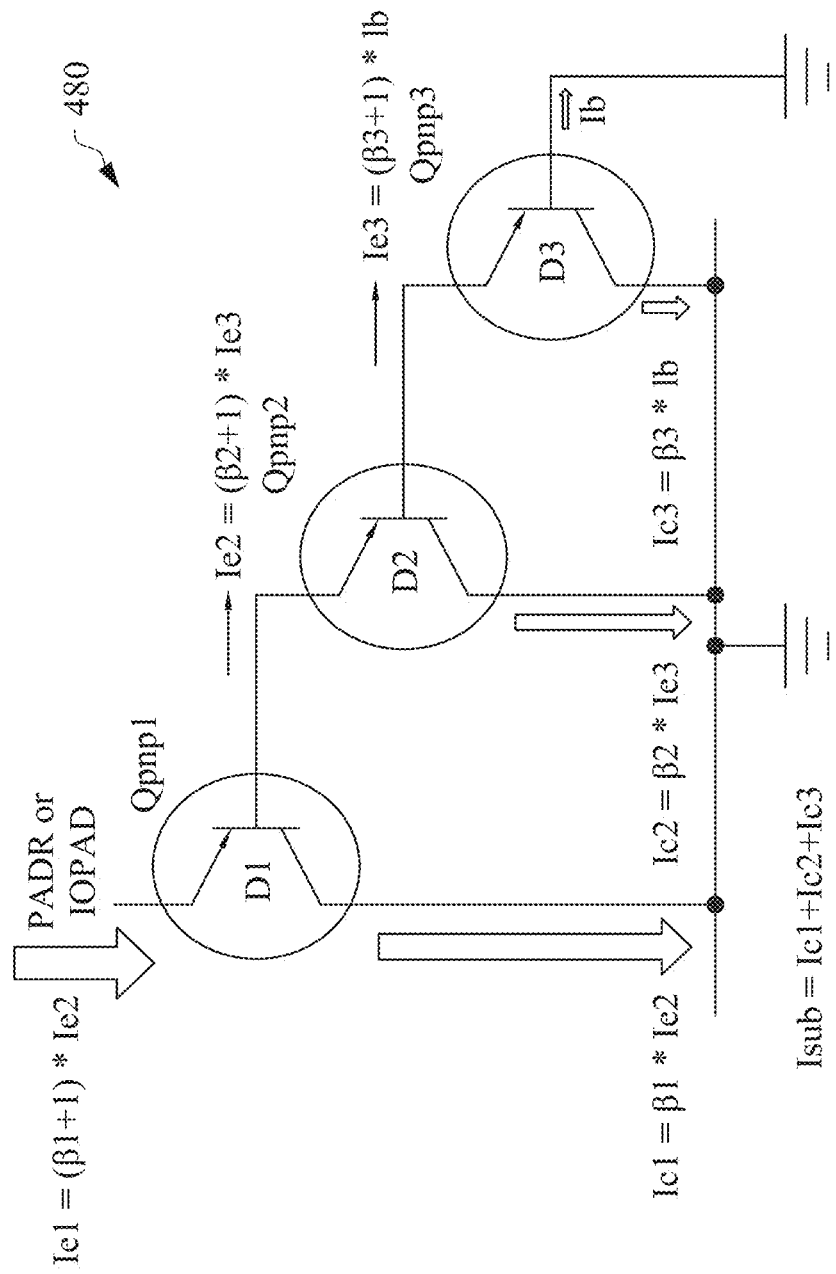
FIG. 4B is a schematic electric diagram of a trigger current source device, in accordance with some embodiments.

FIG. 4B is a schematic electric diagram of the trigger current source device 480.

As can be seen in FIG. 4B, the parasitic transistors Qpnp1, Qpnp2, Qpnp3 are coupled to each other in a Darlington configuration. Specifically, the collectors of all Qpnp1, Qpnp2, Qpnp3 are commonly coupled to the ground which corresponds to the P substrate 310 which is grounded via the P well tap 330 to VSS, the base of Qpnp1 is coupled to the emitter of Qpnp2, the base of Qpnp2 is coupled to the emitter of Qpnp3, and the base of Qpnp3 is grounded.

In an ESD event, an ESD voltage is applied to the emitter of Qpnp1 via IOPAD or PADR. When the ESD voltage applied to the emitter of Qpnp1 is at or greater than a sum of the turning ON voltages of all diodes D1, D2, D3, the parasitic transistors Qpnp1, Qpnp2, Qpnp3 are all turned ON or become conductive. The turned ON Qpnp3 injects a collector current $Ic3=\beta3*Ib$ into the P substrate 310, where Ib is a base current and $\beta3$ is a coefficient of Qpnp3. An emitter current of Qpnp3 is $Ie3=(\beta3+1)*Ib$ and is also a base current of Qpnp2. The turned ON Qpnp2 injects a collector current $Ic2=\beta2*Ie3$ into the P substrate 310, where $\beta2$ is a coefficient of Qpnp3. An emitter current of Qpnp2 is $Ie2=(\beta2+1)*Ie3$ and is also a base current of Qpnp1. The turned ON Qpnp1 injects a collector current $Ic1=\beta1*Ie2$ into the P substrate 310, where $\beta1$ is a coefficient of Qpnp1. An emitter current of Qpnp1 is $Ie1\beta(\beta1+1)*Ie2$. In at least one embodiment, $\beta1$, $\beta2$ and $\beta3$ are equal. As can be seen from the above equations and schematically illustrated in FIG. 4B, Ic1>Ic2>Ic3, i.e., the collector current at each PNP BJT, or each stage, of the Darlington configuration is amplified by the next stage. A sum of all collector currents Ic1+Ic2+Ic3 is the substrate current injected by the trigger current source device 480 into the P substrate 310, and corresponds to Isub injected by the trigger current source device 180 as described with respect to FIG. 3. As a result, it is possible in one or more embodiments including the Darlington configuration to generate a sufficiently high substrate current Isub which, in turn, causes a sufficient voltage drop Vbe across Rsub to trigger turning ON BJT1 at a lowered ESD voltage. In other words, it is possible to lower the ESD trigger voltage.

The described number of three diodes D1, D2, D3 serially coupled into a series in the trigger current source device 480 to create the Darlington configuration with corresponding three stages is an example. In a particular application, each diode D1, D2, D3 has a turning ON voltage of 0.7 V, whereas a nominal voltage at VDD during the normal operation of the internal circuit 140 is 1.2 V. If two diodes are serially coupled into a series corresponding to a Darlington configuration with two stages, the series of two diodes has a turning ON voltage of 1.4 V, which is considered too close to the nominal voltage of 1.2 V and increases a risk of incorrect turning ON of the series of two diodes during the normal operation without an ESD event. Increasing the number of diodes in the series to three increases the turning ON voltage of the series of diodes to 2.1 V, well beyond the nominal voltage of 1.2 V and significantly reduces a risk of incorrect turning ON of the series of diodes during the normal operation. However, in other applications with different VDD nominal voltage and/or diode turning ON voltage, it is possible in at least one embodiment to obtain a lowered ESD trigger voltage with a series of two diodes and a corresponding Darlington configuration with two stages, while still reducing a risk of incorrect turning ON of the series of two diodes during the normal operation. In some embodiments, more than three diodes are serially coupled into a series to create a Darlington configuration with a corresponding number of more than three stages. As more diodes are serially coupled in the series, the corresponding Darlington configuration generates a higher substrate current, and the ESD trigger voltage is further lowered. The increased number of diodes in the series also increases the chip area occupied by the diode series, and is a consideration in balancing between chip area cost and ESD trigger voltage lowering.

Other approaches attempt to lower the ESD trigger voltage by adding extra manufacturing processes, such as, extra implant, masks, or the like. Such extra manufacturing processes increase the manufacturing cost and/or time. Further, there is a possibility that the extra manufacturing processes become ineffective due to device performance and/or operation tuning as well as process variation/fluctuations. In contrast, at least one embodiment advantageously lowers the ESD trigger voltage simply by forming a series of serially coupled diodes with the same manufacturing processes for forming other components of the IC device, without added manufacturing processes such as implants or masks. In some embodiments, it is possible to achieve one or more further advantages including, but not limited to, comparable IO pin leakage to other approach at a lowered ESD trigger voltage, compatible layout style, rules, area with the existing CMOS processes, toleration of process variation/fluctuations, suitability/applicability to both planar and FinFET CMOS technologies.

Figure 5:
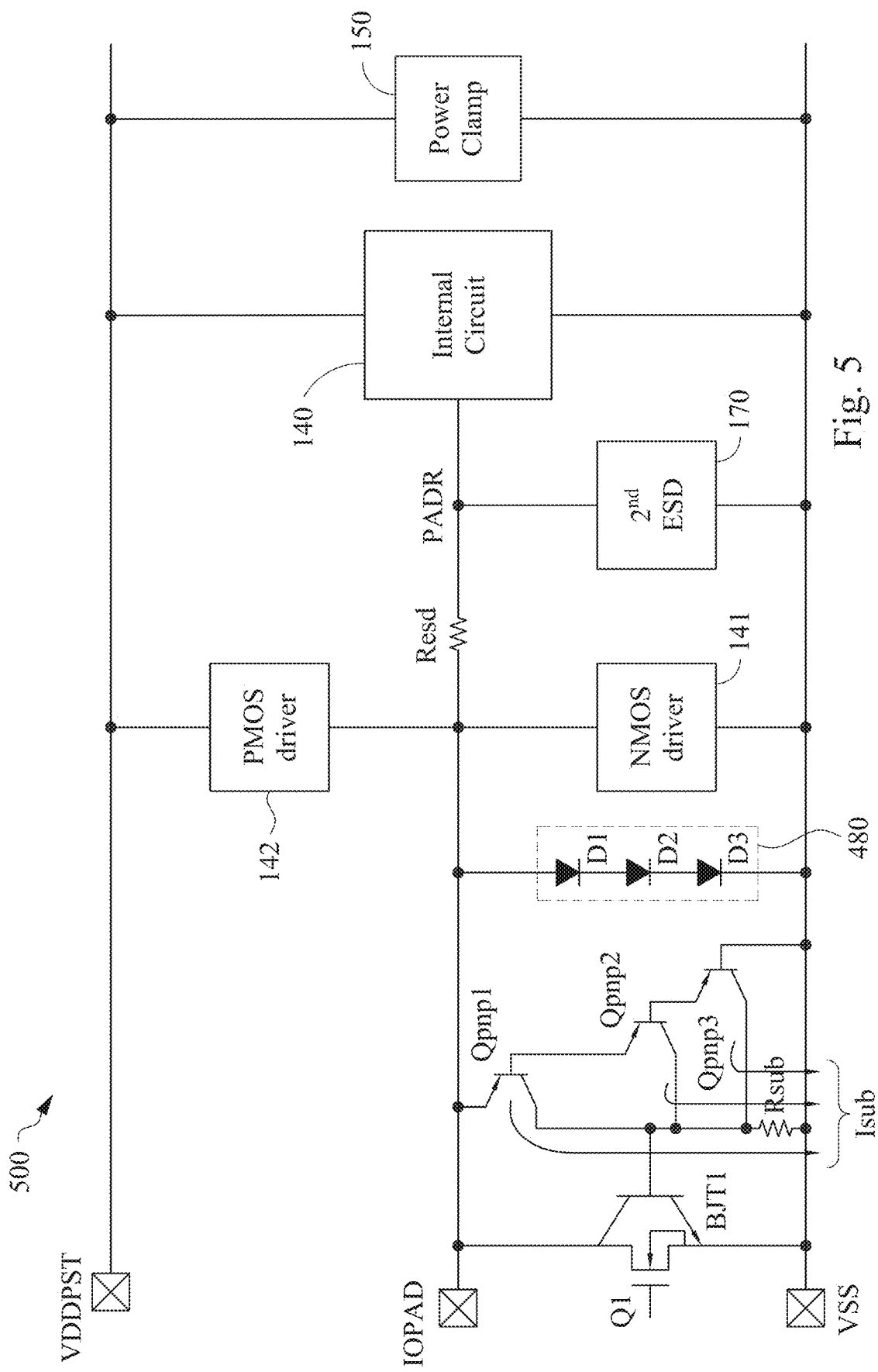
FIG. 5 is a schematic block diagram of an IC device, in accordance with some embodiments.

FIG. 5 is a schematic block diagram of an IC device 500, in accordance with some embodiments. The IC device 500 corresponds to the IC device 100, and implements the trigger current source device 480 as the trigger current source device 180 in the IC device 100.

FIG. 5 shows the parasitic BJT1, Qpnp1, Qpnp2, Qpnp3 of Q1, D1, D2, D3, respectively. FIG. 5 further shows that the substrate current Isub injected by the trigger current source device 480 and flows through Rsub in an ESD event is the sum of the collector currents of Qpnp1, Qpnp2, Qpnp3, as described with respect to FIG. 4B. In some embodiments, the IC device 500 is configured to operate and/or achieves one or more advantages as described with respect to one or more of the IC devices 100, 200, 300, 400.

Figure 6:
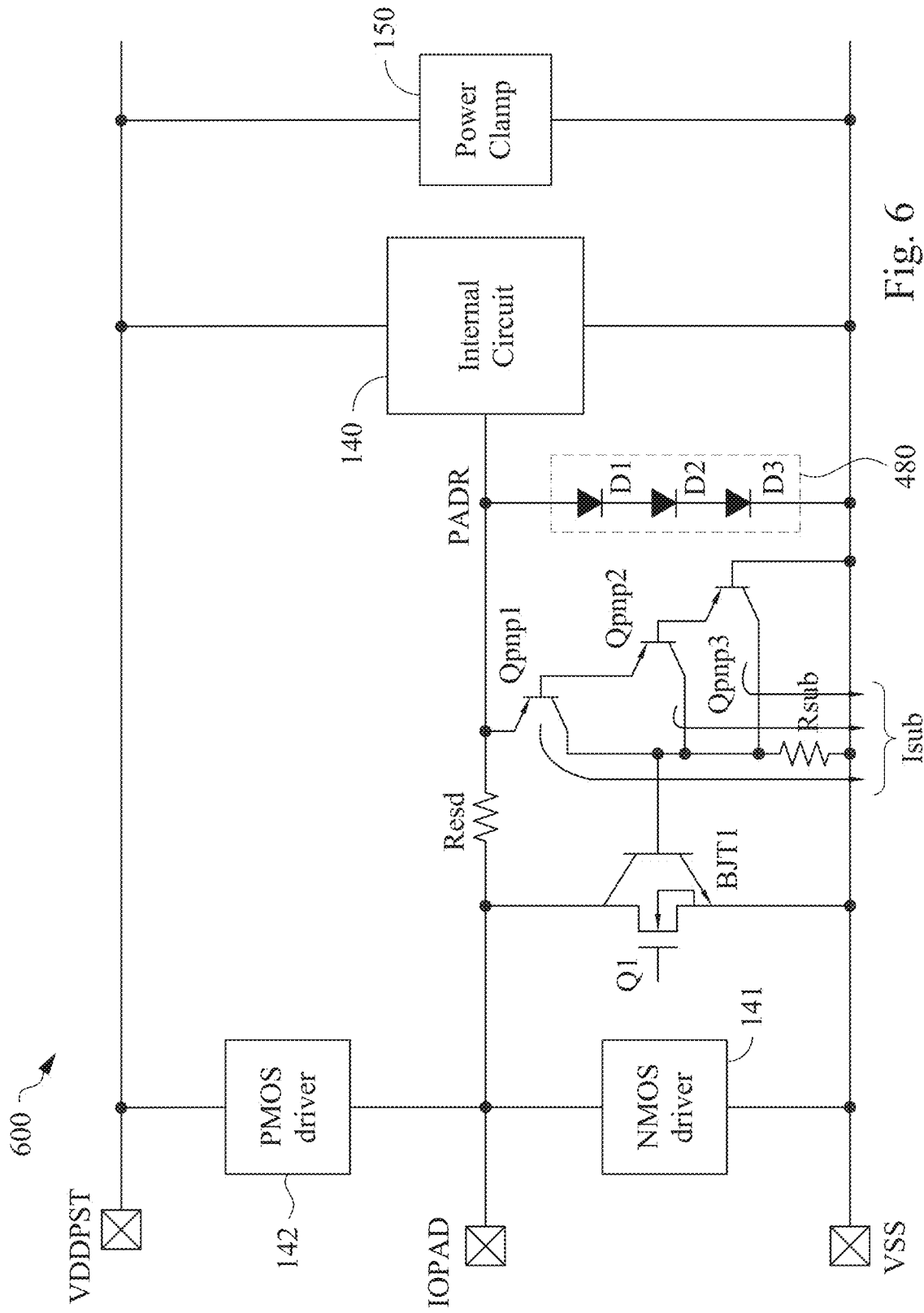
FIG. 6 is a schematic block diagram of an IC device, in accordance with some embodiments.

FIG. 6 is a schematic block diagram of an IC device 600, in accordance with some embodiments. Compared to the IC device 500, the IC device 600 omits the second ESD protection device 170, and implements the trigger current source device 480 as a second ESD protection device.

Specifically, the trigger current source device 480 is coupled to PADR, instead of IOPAD. The trigger current source device 480 has a threshold voltage equal to the sum of the turning ON voltages of all diodes D1, D2, D3. The threshold voltage of the trigger current source device 480 is lower than the ESD trigger voltage of Q1. When an ESD event occurs, the trigger current source device 480 is turned ON before Q1, and operates together with Resd to limit the voltage at PADR, as described with respect to the second ESD protection device 170. At the same time, the turned ON trigger current source device 480 injects the substrate current Isub into the P substrate 310 to trigger turning ON of Q1, as described with respect to FIGS. 4A-4B. When the Q1 is eventually turned ON, the ESD voltage is discharged through the turned ON Q1 to VSS. In some embodiments, the IC device 600 achieves one or more advantages as described with respect to one or more of the IC devices 100, 200, 300, 400, 500.

Figure 7:
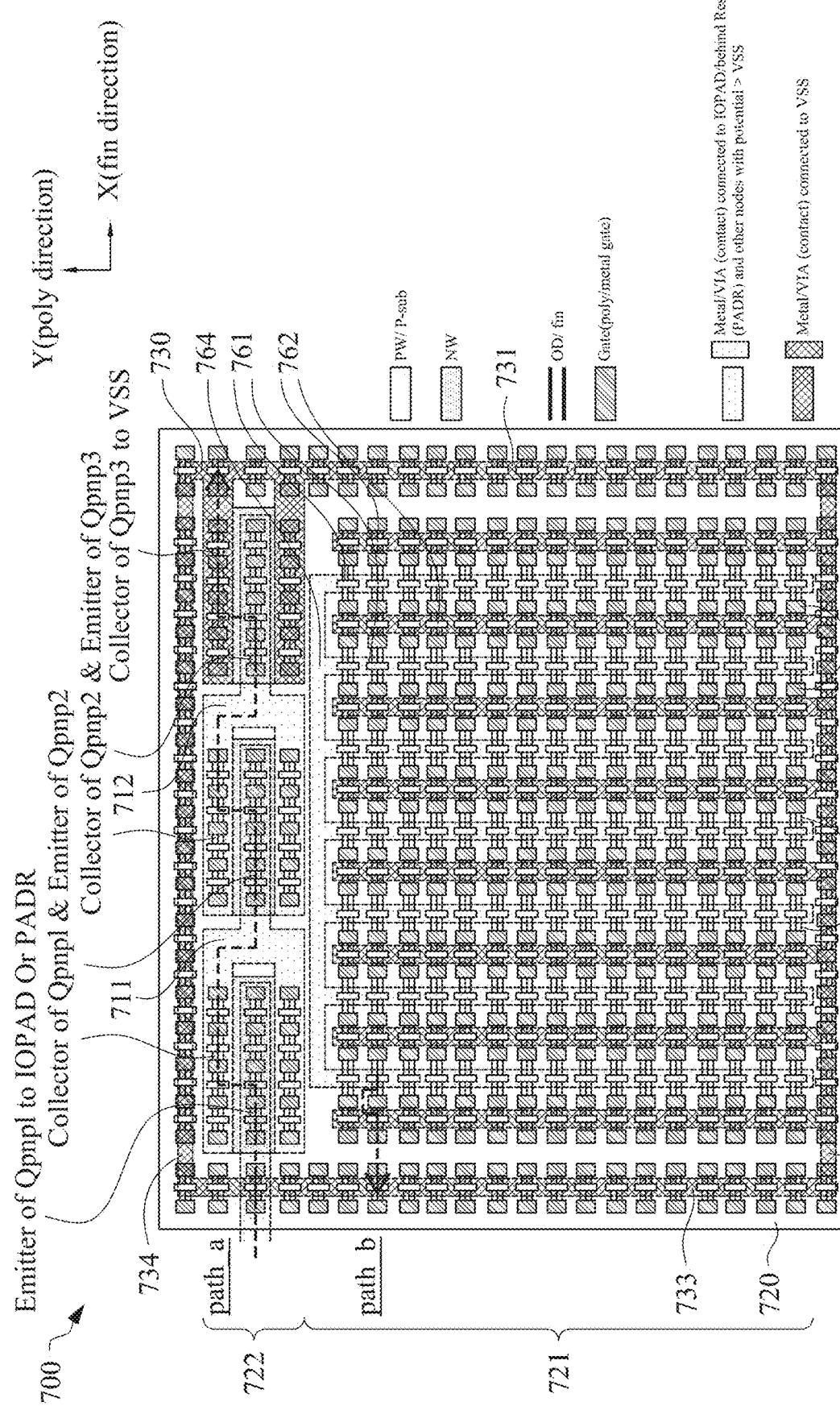
FIG. 7 is a schematic view of an IC layout diagram of an IC device, in accordance with some embodiments.

FIG. 7 is a schematic view of an IC layout diagram 700 of an IC device, in accordance with some embodiments. In at least one embodiment, the IC layout diagram 700 corresponds to that of the IC device 400, IC device 500 or IC device 600.

The IC layout diagram 700 is arranged on a semiconductor substrate (not shown) corresponding to the P substrate 310. The IC layout diagram 700 comprises, over the semiconductor substrate, various active regions, gate regions and conductive patterns arranged over various corresponding wells. The active regions contain fins that extend in the X direction which is also referred to as fin direction. The gate regions contain metal or polysilicon and extend in the Y direction which is also referred to as poly direction. The conductive patterns comprise a conductive material, e.g., metal, and extend in both the X direction and Y direction to couple various active regions through conductive vias. The conductive patterns are shown in the IC layout diagram 700 by respective potentials, rather than by metal layers in which the conductive patterns are arranged. For example, conductive patterns indicated as connected to VSS have the potential of VSS, but are not necessarily arranged in the same metal layer. It is possible that conductive patterns having the same potential are arranged in different metal layers. STI regions are omitted from the IC layout diagram 700 for simplicity.

The IC layout diagram 700 comprises a P well 720 over the semiconductor substrate. The P well 720 corresponds to the P well 320. The P well 720 comprises a first portion 721 and a second portion 722. A P strap 730 is configured to be coupled to VSS, and extends around the first portion 721 and the second portion 722 of the P well 720. In the example configuration in FIG. 7, the P strap 730 comprises conductive patterns 731-734 arranged in a closed figure configuration, e.g., a rectangle, around the first portion 721 and the second portion 722 of the P well 720. The P strap 730 extends over and is coupled by vias to underlying P active regions (labelled as "OD/fin") which correspond to the P well tap 330.

An ESD protection device corresponding to Q1 is arranged over the first portion 721 of the P well 720. The ESD protection device comprises a plurality of first conductive patterns 761, and a plurality of second conductive patterns 762. The first conductive patterns 761 and second conductive patterns 762 extend in a first direction, e.g., the Y direction, and are arranged alternatingly in a second direction, i.e., the X direction, which is transverse to the first direction. The ESD protection device further comprises gate regions 763 corresponding to the gate region 363 and arranged between adjacent first conductive patterns 761 and second conductive patterns 762. A conductive pattern 764 extends in the X direction, is coupled to the first conductive patterns 761, and is configured to couple the first conductive patterns 761 to IOPAD (not shown in FIG. 7). The second conductive patterns 762 are coupled to the conductive pattern 732 of the P strap 730 to be coupled to VSS. The first conductive patterns 761 and second conductive patterns 762 extend across N active regions 765. The active regions 765 underlying the first conductive patterns 761 correspond to the drain region 361, the active regions 765 underlying the second conductive patterns 762 correspond to the source region 362.

A trigger current source device corresponding to the trigger current source device 480 is arranged over the second portion 722 of the P well 720. The trigger current source device comprises three serially coupled P diodes corresponding to a Darlington configuration of Qpnp1, Qpnp2, Qpnp3 coupled by conductive patterns 711, 712 as shown in FIG. 7. The conductive patterns 711, 712 correspond to the conductive patterns 411, 412, respectively. The conductive patterns 711, 712 extend across P active regions in the second portion 722 of the P well 720. An arrow path_a in FIG. 7 indicates a current path through the three diodes serially coupled in the series. An arrow path_b in FIG. 7 indicates an ESD current path as described with respect to FIG. 3. In some embodiments, an IC device corresponding to the IC layout diagram 700 is configured to operate and/or achieves one or more advantages as described with respect to one or more of the IC devices 100, 200, 300, 400, 500, 600.

Figure 8:
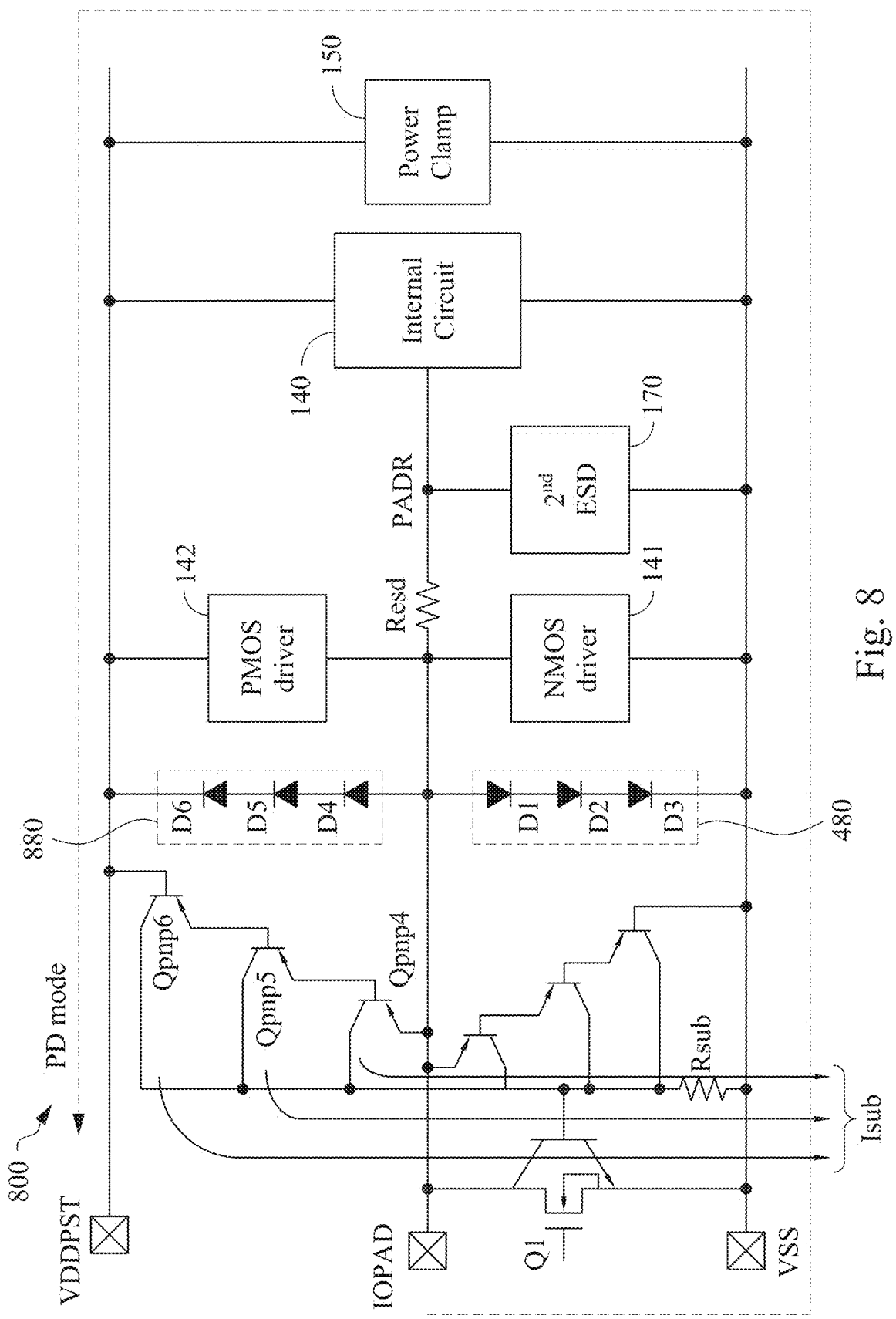
FIG. 8 is a schematic block diagram of an IC device, in accordance with some embodiments.

FIG. 8 is a schematic block diagram of an IC device 800, in accordance with some embodiments. Compared to the IC device 500, the IC device 800 further comprises a second trigger current source device 880 coupled between VDD and IOPAD to lower the ESD trigger voltage in the PD mode.

The second trigger current source device 880 comprises a series of serially coupled diodes D4, D5, D6. In the example configuration in FIG. 8, each diode D4, D5, D6 is a P diode. The diodes D4, D5, D6 comprise parasitic PNP BJTs Qpnp4, Qpnp5, Qpnp6, respectively. Qpnp4, Qpnp5, Qpnp6 are coupled in a Darlington configuration and operate similarly to Qpnp1, Qpnp2, Qpnp3. For example, when an ESD event occurs in the PD mode (VDD is grounded and VSS is floating), Qpnp4, Qpnp5, Qpnp6 in the Darlington configuration become conductive and inject respective collector currents into the P substrate 310. As illustrated in FIG. 8, the sum of these collector currents is the substrate current Isub injected by the second trigger current source device 880 into the P substrate 310. The substrate current Isub flows across Rsub, increases Vbe of Q1, causes Q1 to turn ON, and as a result, the ESD trigger voltage is lowered in the PD mode in a manner similar to how the Darlington configuration of Qpnp1, Qpnp2, Qpnp3 reduces the ESD trigger voltage as described herein. When Q1 is turned ON, the ESD voltage on IOPAD is discharged through Q1, VSS, and the power clamp 150 to VDD, as described herein. In some embodiments, in addition to achieving a lowered ESD trigger voltage in the PD mode, especially for a human body model (HBM) and/or a charged device model (CDM), the IC device 800 is configured to operate and/or achieves one or more advantages as described with respect to one or more of the IC devices 100, 200, 300, 400, 500, 600.

Figure 9:
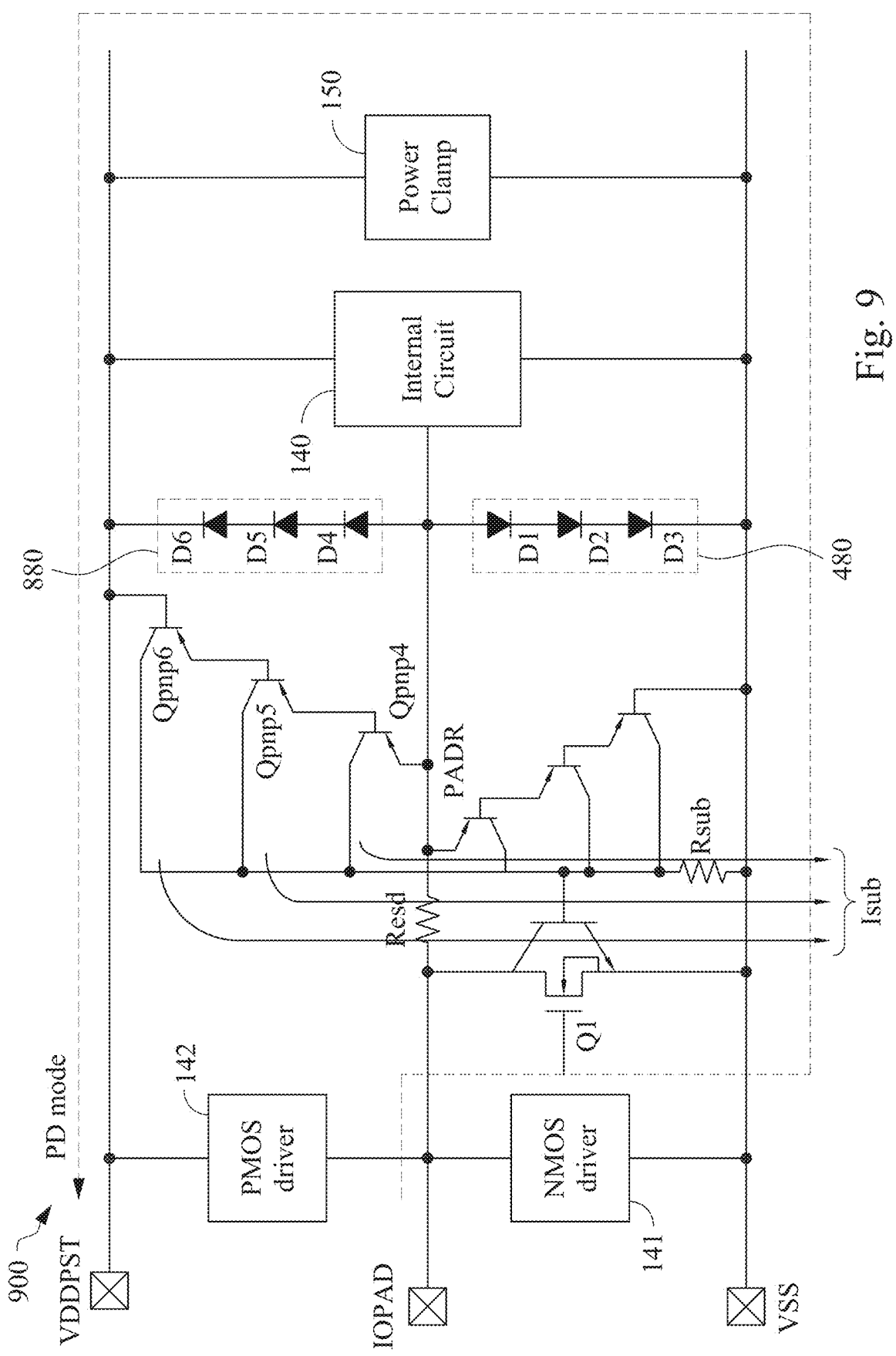
FIG. 9 is a schematic block diagram of an IC device, in accordance with some embodiments.

FIG. 9 is a schematic block diagram of an IC device 900, in accordance with some embodiments. Compared to the IC device 800, the IC device 900 omits the second ESD protection device 170, and implements the trigger current source device 480 and the second trigger current source device 880 as a second ESD protection device.

Specifically, the trigger current source device 480 and the second trigger current source device 880 are coupled to PADR, instead of IOPAD. When an ESD event occurs in the PS mode (VSS is grounded), the IC device 900 operates in a manner similar to the IC device 600. When an ESD event occurs in the PD mode (VDD is grounded), the second trigger current source device 880 is turned ON before Q1, and operates together with Resd to limit the voltage at PADR. At the same time, the turned ON trigger current source device 880 injects the substrate current Isub into the P substrate 310 to trigger turning ON of Q1, as described with respect to FIG. 8. When the Q1 is eventually turned ON, the ESD voltage is discharged through the turned ON Q1, VSS and the power clamp 150 to VDD. In some embodiments, the IC device 900 is configured to operate and/or achieves one or more advantages as described with respect to one or more of the IC devices 100, 200, 300, 400, 500, 600, 800.

Figure 10:
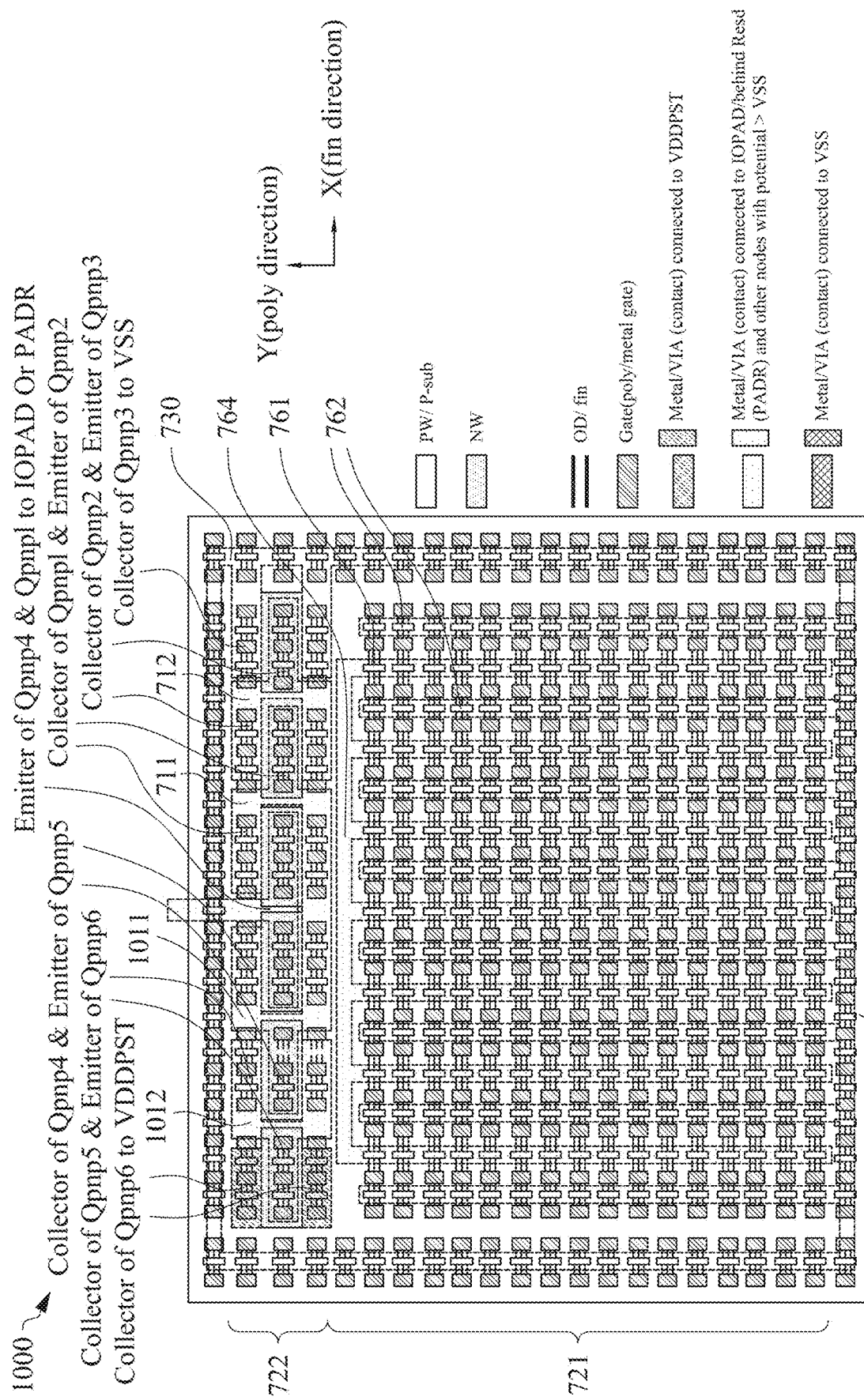
FIG. 10 is a schematic view of an IC layout diagram of an IC device, in accordance with some embodiments.

FIG. 10 is a schematic view of an IC layout diagram 1000 of an IC device, in accordance with some embodiments. In at least one embodiment, the IC layout diagram 1000 corresponds to that of the IC device 800 or the IC device 900.

Compared to the IC layout diagram 700, the IC layout diagram 1000 additionally comprises, in the second portion 722 of the P well 720, a second trigger current source device corresponding to the second trigger current source device 880. The second trigger current source device comprises three serially coupled P diodes corresponding to a Darlington configuration of Qpnp4, Qpnp5, Qpnp6 coupled by conductive patterns 1011, 1012, as indicated in FIG. 10. The conductive patterns 1011, 1012 extend across P active regions in the second portion 722 of the P well 720. In some embodiments, an IC device corresponding to the IC layout diagram 1000 is configured to operate and/or achieves one or more advantages as described with respect to one or more of the IC devices 100, 200, 300, 400, 500, 600, 800, 900.

Figure 11:
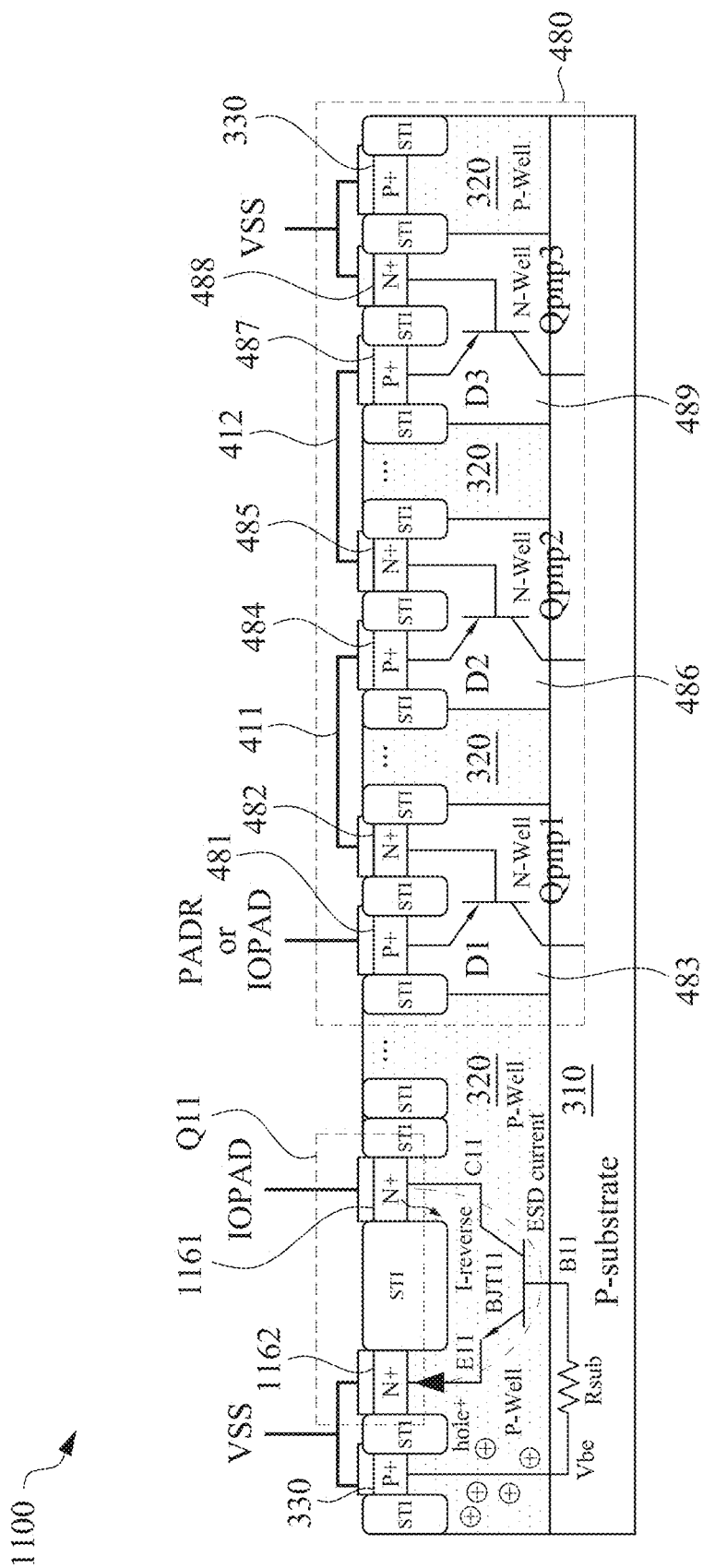
FIG. 11 is a schematic cross-sectional view combined with a schematic electric diagram of an IC device, in accordance with some embodiments.

FIG. 11 is a view similar to FIG. 4A and shows an IC device 1100, in accordance with some embodiments. Compared to the IC device 400, the IC device 1100 comprises a field oxide device (FOD) Q11, instead of the DENMOS Q1, as the first ESD protection device 160.

The FOD Q11 is formed over the P well 320, and comprises a drain region 1161, and a source region 1162. The drain region 1161 and the source region 1162 are N active regions having N dopants implanted in the P well 320. The drain region 1161 is coupled to IOPAD, and the source region 1162 is coupled to VSS.

The schematic electric diagram of the IC device 1100 in FIG. 11 shows a parasitic transistor BJT11 and Rsub. BJT11 is an NPN BJT formed by the formation of the N drain region 1161 and the N source region 1162 in the P well 320 and the P substrate 1110. The drain region 1161 of Q11 corresponds to a collector C11 of BJT11, the source region 1162 of Q11 corresponds to an emitter E11 of BJT11, and the P well 320 and P substrate 1110 correspond to a base B11 of BJT11. In other words, the collector C11 and the emitter E11 are coupled between the IOPAD and VSS. Rsub represents substrate resistance of the P substrate 310 and/or the P well 320 between the base B11 and the P well tap 330. A voltage drop across Rsub corresponds to a base-emitter voltage Vbe between the base B11 and the emitter E11 of BJT11.

In the absence of an ESD event, Vbe of BJT11 is lower than a threshold voltage of BJT11. For example, Vbe is zero. As a result, BJT11 is turned OFF.

In an ESD event, an ESD voltage is applied to IOPAD. The ESD voltage on IOPAD causes the PN junction between the N drain region 1161 and the P well 320 to be reverse-biased until avalanche breakdown occurs, causing an N+/P well reverse leakage (I-reverse) to flow from the drain region 1161 to the P well tap 330. The trigger current source device 480 injects a substrate current Isub, to increase Vbe, trigger turning ON BJT11, and discharge the ESD voltage from IOPAD to VSS through an ESD current at a lowered ESD trigger voltage, as described with respect to FIGS. 4A-4B. In some embodiments, the IC device 1100 is configured to operate and/or achieves one or more advantages as described with respect to one or more of the IC devices 100, 200, 300, 400.

Figure 12:
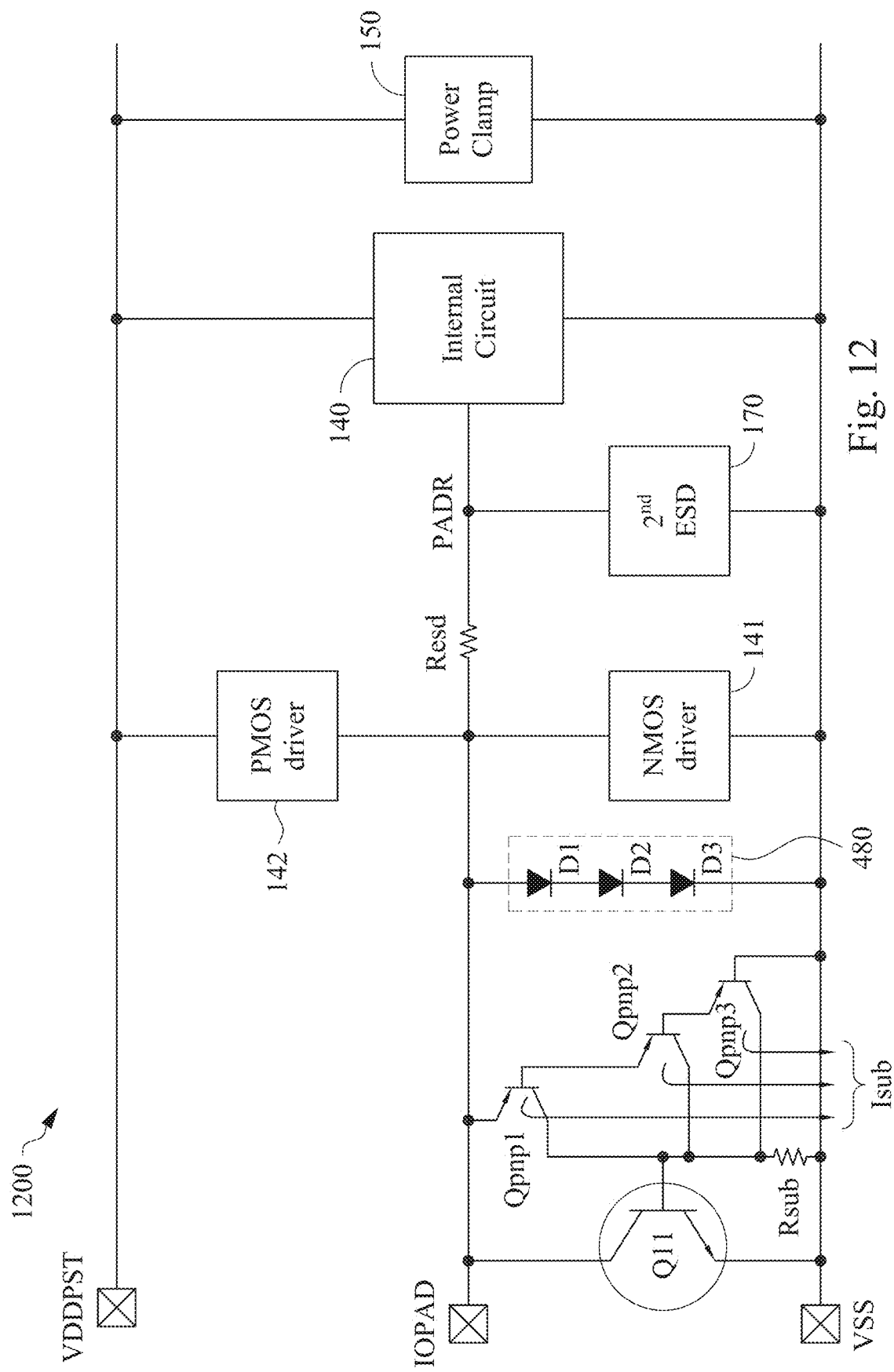
FIG. 12 is a schematic block diagram of an IC device, in accordance with some embodiments.

FIG. 12 is a schematic block diagram of an IC device 1200, in accordance with some embodiments. Compared to the IC device 500, the IC device 1200 comprises FOD Q11 instead of Q1. Further embodiments where FOD Q11 replaces Q1 in the IC devices 600, 800, 900 are within the scope of this disclosure. The described IC devices with FOD Q11 replacing Q1 are configured to operate and/or achieves one or more advantages as described with respect to one or more of the IC devices 500, 600, 800, 900.

Figure 13:
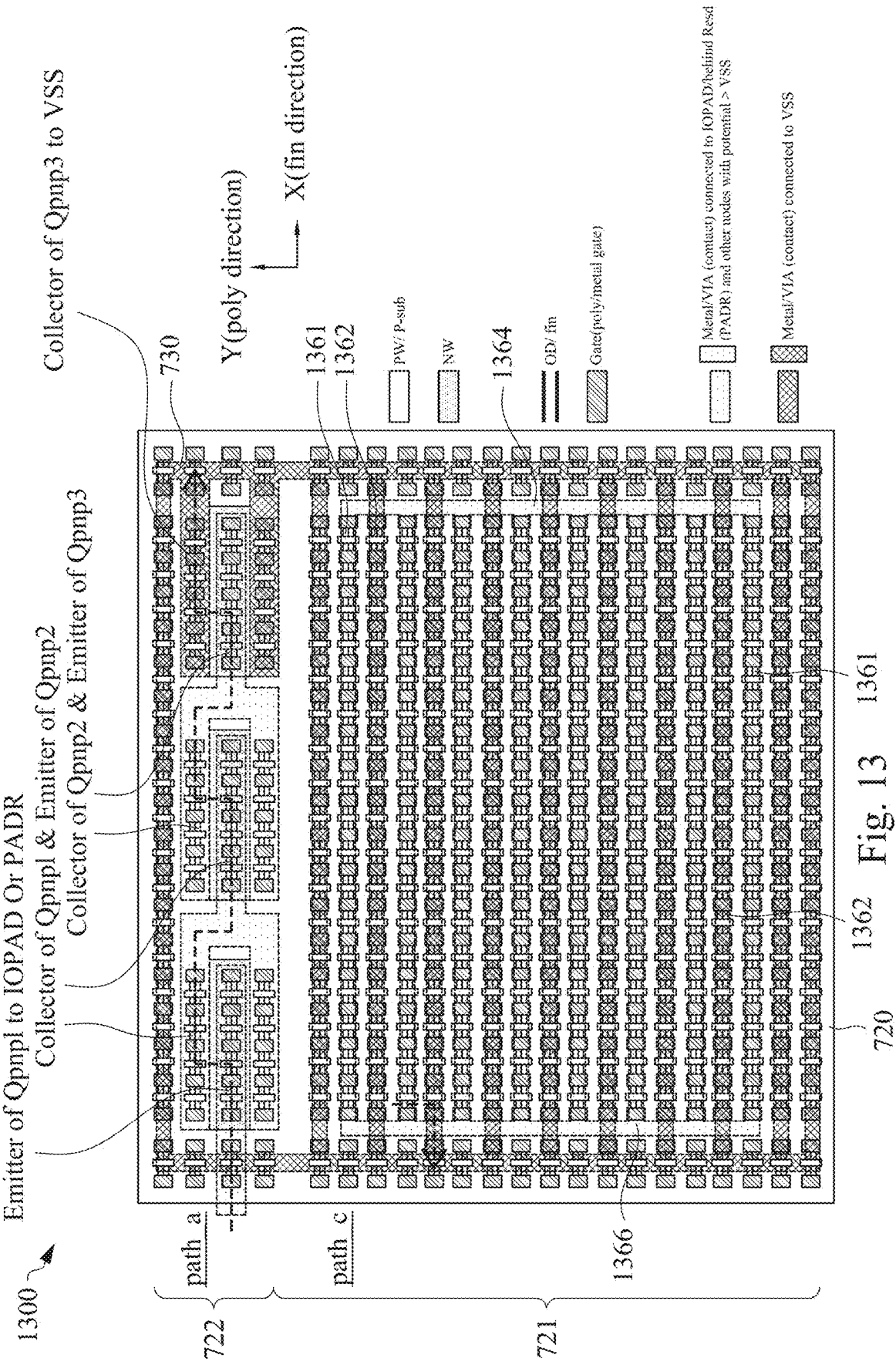
FIG. 13 is a schematic view of an IC layout diagram of an IC device, in accordance with some embodiments.

FIG. 13 is a schematic view of an IC layout diagram 1300 of an IC device, in accordance with some embodiments. In at least one embodiment, the IC layout diagram 1300 corresponds to that of the IC device 1100 or the IC device 1200.

Compared to the IC layout diagram 700, the IC layout diagram 1300 comprises the same trigger current source device over the second portion 722 of the P well 720. However, in the first portion 721 of the P well 720, the IC layout diagram 1300 is different from the IC layout diagram 700. Specifically, an ESD protection device corresponding to FOD Q11 is arranged over the first portion 721 of the P well 720. The ESD protection device comprises a plurality of first conductive patterns 1361, and a plurality of second conductive patterns 1362. The first conductive patterns 1361 and second conductive patterns 1362 extend in a first direction, e.g., the X direction, and are arranged alternatingly in a second direction, i.e., the Y direction, which is transverse to the first direction. Conductive patterns 1364, 1366 extend in the Y direction, are coupled to opposite ends of the first conductive patterns 1361, and are configured to couple the first conductive patterns 1361 to IOPAD (not shown in FIG. 13). The second conductive patterns 1362 are coupled to the P strap 730 to be coupled to VSS. The first conductive patterns 1361 and second conductive patterns 1362 extend across N active regions. The active regions underlying the first conductive patterns 1361 correspond to the drain region 1161, the active regions underlying the second conductive patterns 1362 correspond to the source region 1162. An arrow path_c in FIG. 13 indicates an ESD current path as described with respect to FIG. 11. In some embodiments, an IC device corresponding to the IC layout diagram 1300 is configured to operate and/or achieves one or more advantages as described with respect to one or more of the IC devices 100, 200, 300, 400, 500, 600, 1100, 1200.

In some embodiments where FOD Q11 replaces Q1 in the IC devices 800, 900 with two trigger current source devices 480, 880, the obtained IC devices have a corresponding IC layout diagram which is a combination of the layout in the first portion 721 in FIG. 13 with the layout of the second portion 722 in FIG. 10.

Figure 14:
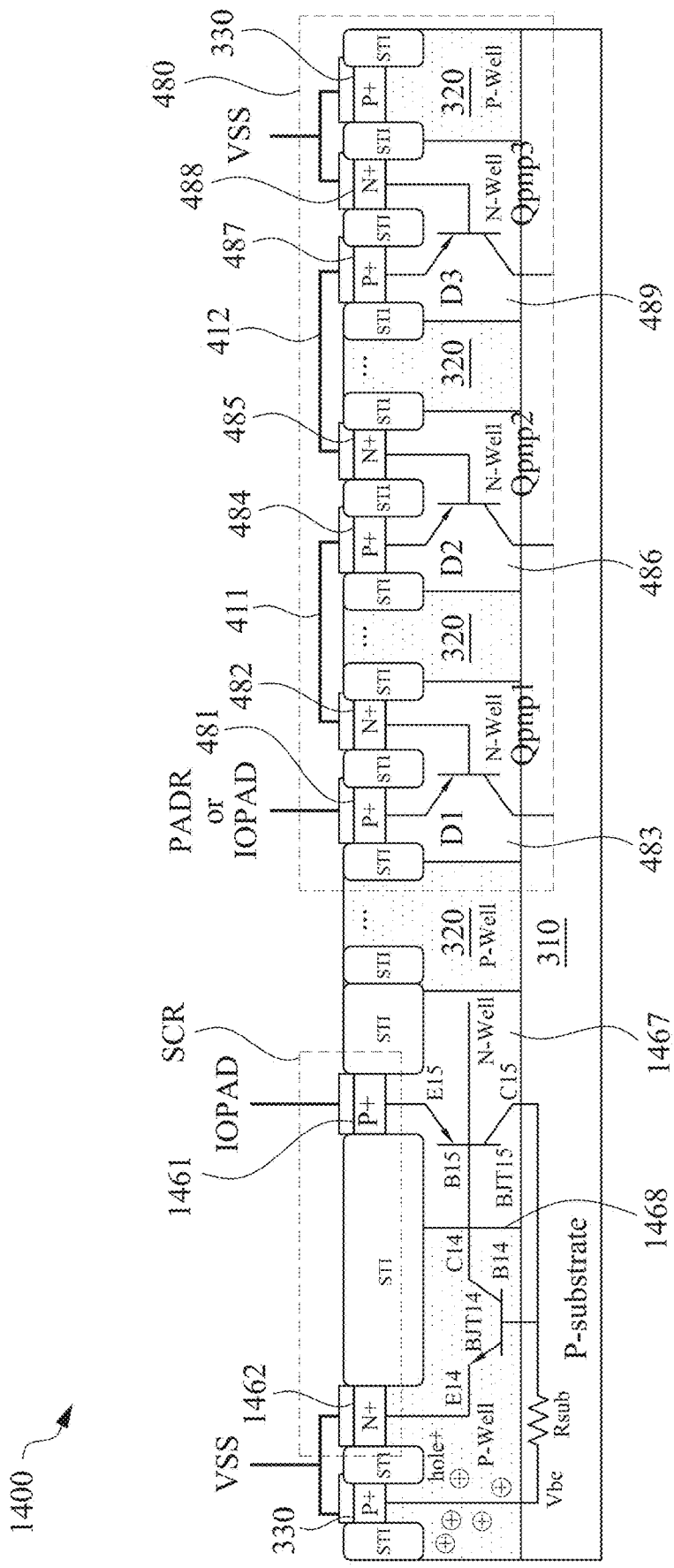
FIG. 14 is a schematic cross-sectional view combined with a schematic electric diagram of an IC device, in accordance with some embodiments.

FIG. 14 is a view similar to FIG. 4A and shows an IC device 1400, in accordance with some embodiments. Compared to the IC device 400, the IC device 1400 comprises a silicon-controlled-rectifier SCR, instead of the DENMOS Q1, as the first ESD protection device 160.

The SCR is formed over the P well 320, and comprises an anode 1461, and a cathode 1462. The anode 1461 comprises a P active region having P dopants implanted in an N well 1467 over the P well 320. The cathode 1462 comprises an N active region having N dopants implanted in the P well 320. The anode 1461 is coupled to IOPAD, and the cathode 1462 is coupled to VSS.

The schematic electric diagram of the IC device 1400 in FIG. 14 shows parasitic transistors BJT14, BJT15 and Rsub. BJT14 is an NPN BJT and BJT15 is a PNP BJT which are formed by the formation of the N cathode 1462 in the P well 320, and the P anode 1461 in the N well 1467. The N well 1467 corresponds to a collector C14 of BJT14, the cathode 1462 corresponds to an emitter E14 of BJT14, and the P well 320 and P substrate 310 correspond to a base B14 of BJT14. In other words, the collector C14 and the emitter E14 are coupled between the IOPAD and VSS. The P well 320 and P substrate 310 correspond to a collector C15 of BJT15, the anode 1461 corresponds to an emitter E15 of BJT15, and the N well 1467 corresponds to a base B15 of BJT15. In at least one embodiment, the N well 1467 is floating or coupled to other nodes. Rsub represents substrate resistance of the P substrate 310 and/or the P well 320 between the base B14 and the P well tap 330. A voltage drop across Rsub corresponds to a base-emitter voltage Vbe between the base B14 and the emitter E14 of BJT14.

In the absence of an ESD event, Vbe of BJT14 is lower than a threshold voltage of BJT14. For example, Vbe is zero. As a result, BJT14 is turned OFF. BJT15 is also turned OFF. The SCR is non-conductive and does not affect the normal operation of the internal circuit 140.

In an ESD event, an ESD voltage is applied to IOPAD and causes a PN junction 1468 between the N well 1467 and the P well 320 to be reverse biased until avalanche breakdown occurs, causing a reverse leakage (not shown) to flow to the P well tap 330. The trigger current source device 480 injects a substrate current Isub to increase Vbe and trigger turning ON BJT14, as described with respect to FIGS. 4A-4B. The turning ON of BJT14 leads to turning ON BJT15 and causes the ESD voltage to be discharged from IOPAD, through the anode 1461, the turned ON BJT15, BJT14, and the cathode 1462 to VSS. In some embodiments, the IC device 1400 is configured to operate and/or achieves one or more advantages as described with respect to one or more of the IC devices 100, 200, 300, 400.

Figure 15:
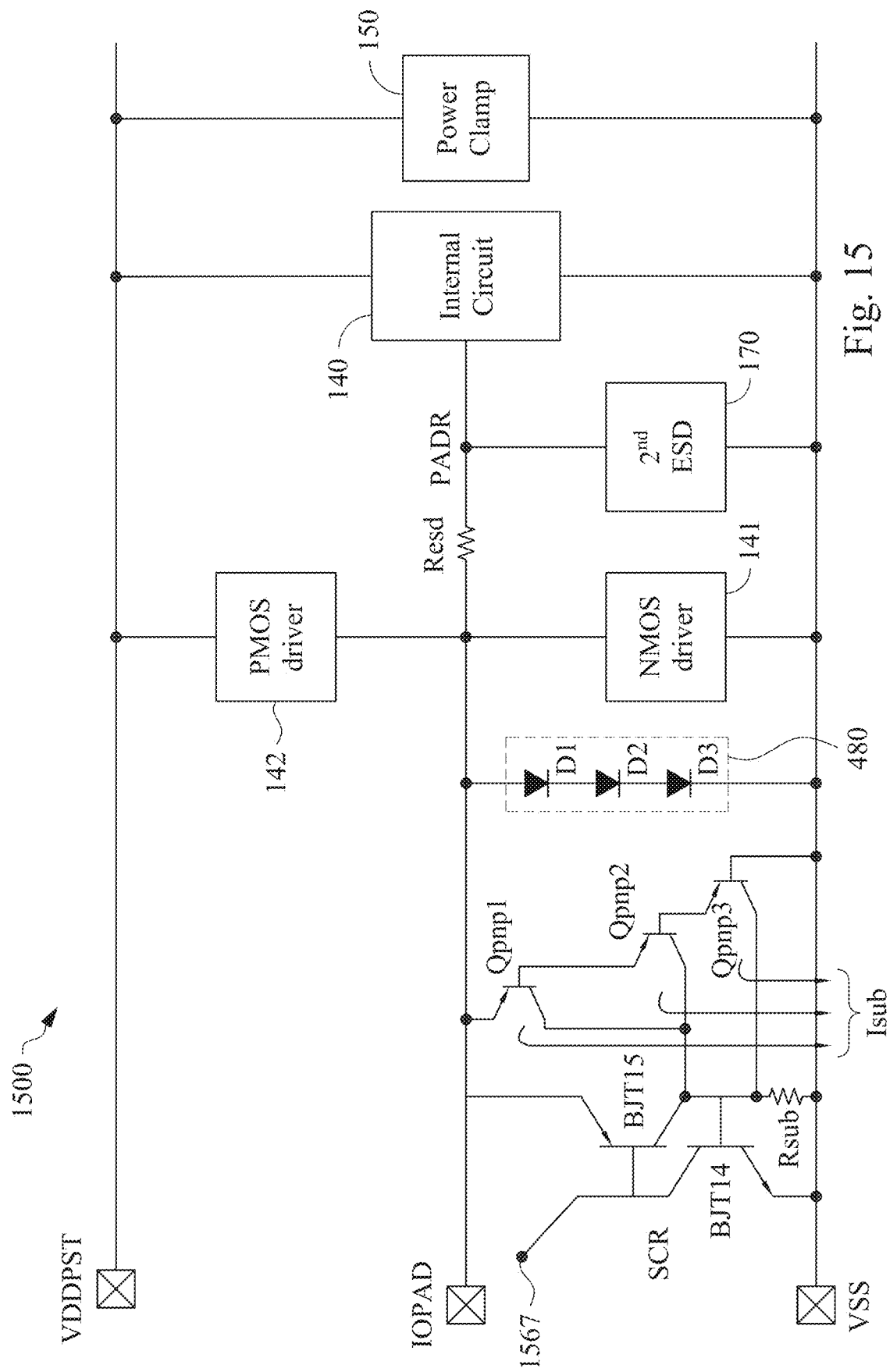
FIG. 15 is a schematic block diagram of an IC device, in accordance with some embodiments.

FIG. 15 is a schematic block diagram of an IC device 1500, in accordance with some embodiments. Compared to the IC device 500, the IC device 1500 comprises SCR instead of Q1. A floating node 1567 in the schematic of SCR in FIG. 15 corresponds to the floating N well 1467. Further embodiments where SCR replaces Q1 in the IC devices 600, 800, 900 are within the scope of this disclosure. The described IC devices with SCR replacing Q1 are configured to operate and/or achieves one or more advantages as described with respect to one or more of the IC devices 500, 600, 800, 900.

Figure 16:
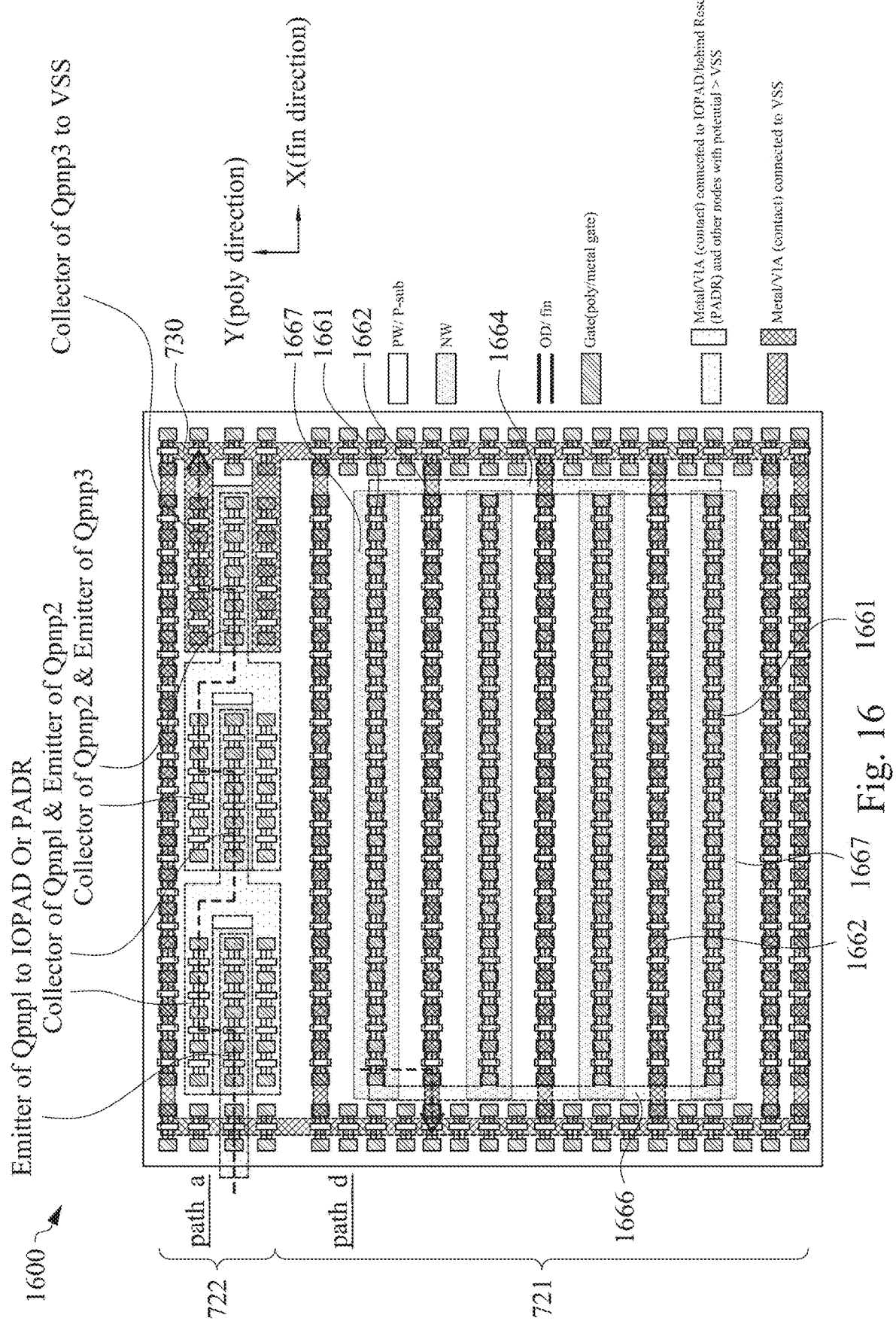
FIG. 16 is a schematic view of an IC layout diagram of an IC device, in accordance with some embodiments.

FIG. 16 is a schematic view of an IC layout diagram 1600 of an IC device, in accordance with some embodiments. In at least one embodiment, the IC layout diagram 1600 corresponds to that of the IC device 1400 or the IC device 1500.

Compared to the IC layout diagram 700, the IC layout diagram 1600 comprises the same trigger current source device over the second portion 722 of the P well 720. However, in the first portion 721 of the P well 720, the IC layout diagram 1600 is different from the IC layout diagram 700. Specifically, an ESD protection device corresponding to SCR is arranged over the first portion 721 of the P well 720. The ESD protection device comprises a plurality of first conductive patterns 1661, and a plurality of second conductive patterns 1662. The first conductive patterns 1661 and second conductive patterns 1662 extend in a first direction, e.g., the X direction, and are arranged alternatingly in a second direction, i.e., the Y direction, which is transverse to the first direction. Conductive patterns 1664, 1666 extend in the Y direction, are coupled to opposite ends of the first conductive patterns 1661, and are configured to couple the first conductive patterns 1661 to IOPAD (not shown in FIG. 16). The second conductive patterns 1662 are coupled to the P strap 730 to be coupled to VSS. The first conductive patterns 1661 extend across P active regions which correspond to the anode 1461 and which are formed over N wells 1667. The N wells 1667 correspond to the N well 1467. The second conductive patterns 1662 extend across N active regions which correspond to the cathode 1462. An arrow path_d in FIG. 16 indicates an ESD current path from the anode to the cathode in the SCR. In some embodiments, an IC device corresponding to the IC layout diagram 1600 is configured to operate and/or achieves one or more advantages as described with respect to one or more of the IC devices 100, 200, 300, 400, 500, 600, 800, 900.

In some embodiments where SCR replaces Q1 in the IC devices 800, 900 with two trigger current source devices 480, 880, the obtained IC devices have a corresponding IC layout diagram which is a combination of the layout in the first portion 721 in FIG. 16 with the layout of the second portion 722 in FIG. 10.

Figure 17:
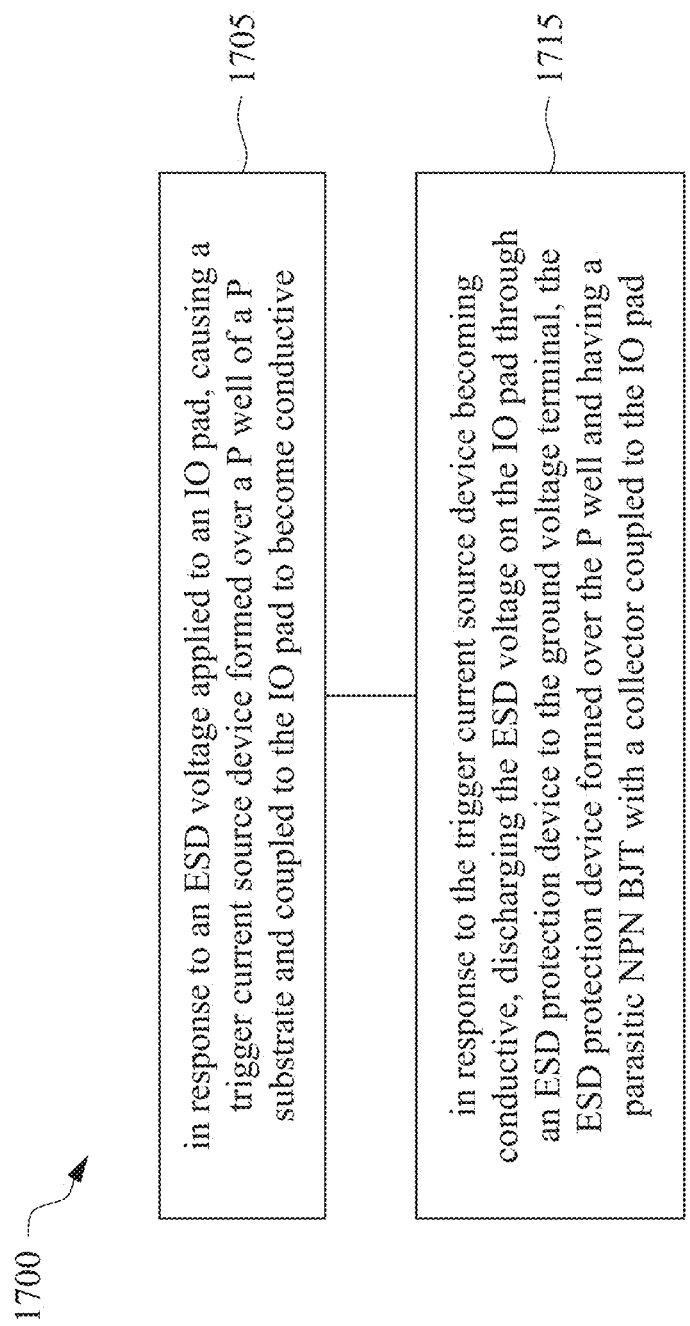
FIG. 17 is a flow chart of a method of generating an IC layout diagram, in accordance with some embodiments.

FIG. 17 is a flow chart of a method 1700 for ESD protection of an IC device, in accordance with some embodiments. In at least one embodiment, the method 1700 is performed in at least one of the IC devices 100, 200, 300, 400, 500, 600, 800, 900, 1100, 1200, 1400, 1500.

At operation 1705, in response to an ESD voltage applied to an IO pad, a trigger current source device formed over a P well of a P substrate and coupled to the IO pad, either directly or via a current limiting resistor, is caused to become conductive. For example, as described with respect to FIGS. 3, 4A and 4B, the trigger current source device 480 is caused to become conductive and inject, in response to an ESD voltage applied to IOPAD, a substrate current Isub of holes into the P substrate 310, by using a Darlington configuration of parasitic BJTs in the trigger current source device 480.

At operation 1715, in response to the trigger current source device becoming conductive, the ESD voltage on the IO pad is discharged through an ESD protection device to the ground voltage terminal. The ESD protection device is formed over the P well and has a parasitic NPN BJT with a collector coupled to the IO pad. For example, as described with respect to FIG. 3, the substrate current Isub of holes, which is injected into the P substrate 310 by the conductive trigger current source device 480, flows to the P well tap 330 of the P well 320 in the P substrate 310 due to the low voltage level of a ground voltage terminal VSS coupled to the P well tap 330. The current of holes flowing in the P well 320 and/or the P substrate 310 increases a voltage drop across a substrate resistance Rsub, i.e., increases a base-emitter voltage Vbe of the parasitic NPN BJT1 of the ESD protection device Q1 formed over the P well 320. In response to the base-emitter voltage at or above a threshold voltage, the parasitic NPN BJT is turned ON to discharge the ESD voltage on the IO pad through the turned ON parasitic BJT to the ground voltage terminal. For example, as described with respect to FIG. 3, when Vbe is at or above a threshold voltage of BJT1, BJT1 is turned ON to discharge the ESD voltage on IOPAD through the turned ON BJT1 to VSS. In at least one embodiment, because the substrate current Isub is injected by the trigger current source device 180 into the P substrate 310 when an ESD event occurs, Vbe rises faster toward the threshold voltage of BJT1, BJT1 is turned ON faster, and the ESD voltage on IOPAD is discharged faster, at a lowered ESD trigger voltage.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, an integrated circuit (IC) device comprises: a first power supply voltage terminal configured to receive a first power supply voltage, an input/output (IO) pad, a first electrostatic discharge (ESD) protection device coupled between the first power supply voltage terminal and the IO pad, a first trigger current source device coupled between the first power supply voltage terminal and the IO pad, and a semiconductor substrate over which at least the first ESD protection device and the first trigger current source device are formed. The first ESD protection device comprises, over the semiconductor substrate, a parasitic bipolar junction transistor (BJT) having a collector and an emitter coupled between the IO pad and the first power supply voltage terminal, and a base coupled via a substrate resistance to a well tap which is coupled to the first power supply voltage terminal. The first trigger current source device is configured to, in response to an ESD voltage applied to the IO pad, become conductive and cause discharge of the ESD voltage on the IO pad through the first ESD protection device to the first power supply voltage terminal.

In some embodiments, an integrated circuit (IC) device comprises a P substrate having a P well, an electrostatic discharge (ESD) protection device over a first portion of the P well, a plurality of P diodes over a second portion of the P well, and a P strap over the P well. The ESD protection device comprises a plurality of first conductive patterns extending in a first direction and configured to be coupled to an IO pad, a plurality of second conductive patterns extending in the first direction and configured to be coupled to a first power supply voltage terminal. The plurality of first conductive patterns and the plurality of second conductive patterns are arranged alternatingly in a second direction transverse to the first direction. Each P diode among the plurality of P diodes is over a corresponding N well in the second portion of the P well, and comprises, over the P substrate, a parasitic PNP BJT. The plurality of P diodes comprises a first series of serially coupled P diodes having the corresponding parasitic PNP BJTs coupled to each other in a Darlington configuration. An emitter of the parasitic PNP BJT of a first P diode in the first series of P diodes is configured to be coupled to the IO pad, or to an intermediate node which is coupled to the IO pad via a current limiting resistor. A collector of the parasitic PNP BJT of a last P diode in the first series of P diodes is configured to be coupled to the first power supply voltage terminal. The P strap comprises a plurality of third conductive patterns extending around the first portion and the second portion of the P well and configured to be coupled to the first power supply voltage terminal.

In some embodiments, a method of protecting a circuit coupled to an input/output (IO) pad in an electrostatic discharge (ESD) event comprises, in response to an ESD voltage applied to the IO pad, causing a trigger current source device, which is formed over a P well of a P substrate of the circuit and coupled to the IO pad either directly or via a current limiting resistor, to become conductive. A P well tap over the P well is coupled to a ground voltage terminal. An ESD protection device formed over the P well has a parasitic NPN bipolar junction transistor (BJT), and a collector of the parasitic NPN BJT is coupled to the IO pad. In response to the trigger current source device becoming conductive, discharging the ESD voltage on the IO pad through the ESD protection device to the ground voltage terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a first power supply voltage terminal configured to receive a first power supply voltage;
a second power supply voltage terminal configured to receive a second power supply voltage;
a circuit coupled to the first power supply voltage terminal and the second power supply voltage terminal;
an input/output (IO) pad different from the first power supply voltage terminal and the second power supply voltage terminal, the IO pad configured to input or output a signal to or from the circuit;
a first electrostatic discharge (ESD) protection device coupled between the first power supply voltage terminal and the IO pad;
a first trigger current source device coupled between the first power supply voltage terminal and the IO pad; and
a semiconductor substrate over which at least the first ESD protection device and the first trigger current source device are formed,
wherein
the first ESD protection device comprises, over the semiconductor substrate, a parasitic bipolar junction transistor (BJT) having
a collector and an emitter coupled between the IO pad and the first power supply voltage terminal, and
a base coupled via a substrate resistance to a well tap which is coupled to the first power supply voltage terminal, and
the first trigger current source device is configured to, in response to an ESD voltage applied to the IO pad, become conductive and cause discharge of the ESD voltage on the IO pad through the first ESD protection device to the first power supply voltage terminal.

2. The IC device of claim 1, further comprising:
a current limiting resistor coupled between the IO pad and an intermediate node; and
a second ESD protection device coupled between the intermediate node and the first power supply voltage terminal,
wherein the second ESD protection device has a lower ESD trigger voltage than the first ESD protection device.

3. The IC device of claim 1, further comprising:
a current limiting resistor coupled between the IO pad and an intermediate node,
wherein the first trigger current source device is coupled to the IO pad via the intermediate node and the current limiting resistor, and is configured as a second ESD protection device having a lower ESD trigger voltage than the first ESD protection device.

4. The IC device of claim 1, further comprising:
a power clamp coupled between the first power supply voltage terminal and the second power supply voltage terminal; and
a second trigger current source device coupled between the second power supply voltage terminal and the IO pad,
wherein the second trigger current source device is formed over the semiconductor substrate, and is configured to, in response to the ESD voltage applied to the IO pad, become conductive and cause discharge of the ESD voltage on the IO pad serially through the first ESD protection device, the first power supply voltage terminal and the power clamp to the second power supply voltage terminal.

5. The IC device of claim 4, further comprising:
a current limiting resistor coupled between the IO pad and an intermediate node; and
a second ESD protection device coupled between the intermediate node and the first power supply voltage terminal,
wherein the second ESD protection device has a lower ESD trigger voltage than the first ESD protection device.

6. The IC device of claim 4, further comprising:
a current limiting resistor coupled between the IO pad and an intermediate node,
wherein the first and second trigger current source devices are coupled to the IO pad via the intermediate node and the current limiting resistor, and are configured as a second ESD protection device having a lower ESD trigger voltage than the first ESD protection device.

7. The IC device of claim 1, wherein
the first trigger current source device comprises a series of diodes serially coupled to each other,
each diode in the series of diodes comprises, over the semiconductor substrate, a parasitic BJT,
the parasitic BJTs of the series of diodes are coupled to each other in a Darlington configuration,
a first end of the series of diodes is coupled
to the IO pad, or
to an intermediate node which is coupled to the IO pad via a current limiting resistor, and
a second end of the series of diodes is coupled to the first power supply voltage terminal.

8. The IC device of claim 7, wherein
the series of diodes comprises at least three diodes.

9. The IC device of claim 7, wherein
the semiconductor substrate comprises a P substrate,
the series of diodes comprises P diodes, and
the parasitic BJTs of the P diodes comprise PNP BJTs.

10. The IC device of claim 9, wherein
the first ESD protection device comprises a drain-extended n-channel metal-oxide semiconductor (DENMOS) transistor having a source region, a gate region and a drain region over a P well of the P substrate,
the well tap comprises a P well tap over the P well,
the source region of the DENMOS transistor corresponds to the emitter of the parasitic BJT of the first ESD protection device, and is coupled to the first power supply voltage terminal, and
the drain region of the DENMOS transistor corresponds to the collector of the parasitic BJT of the first ESD protection device, and is coupled to the IO pad.

11. The IC device of claim 10, wherein
the gate region of the DENMOS transistor is coupled to the first power supply voltage terminal.

12. The IC device of claim 10, further comprising:
a p-channel metal-oxide semiconductor (PMOS) transistor coupled between the second power supply voltage terminal and the IO pad; and
a control circuit,
wherein
the gate region of the DENMOS transistor is coupled to the control circuit, and
in absence of the ESD voltage on the IO pad, the DENMOS transistor is configured to, under control of the control circuit, operate in cooperation with the PMOS transistor as a driver circuit to handle signal transfer between the circuit and the IO pad.

13. The IC device of claim 9, wherein
the first ESD protection device comprises a field oxide device (FOD) having first and second N active regions over a P well of the P substrate,
the well tap comprises a P well tap over the P well,
the first N active region of the FOD corresponds to the emitter of the parasitic BJT of the first ESD protection device, and is coupled to the first power supply voltage terminal, and
the second N active region of the FOD corresponds to the collector of the parasitic BJT of the first ESD protection device, and is coupled to the IO pad.

14. The IC device of claim 9, wherein
the first ESD protection device comprises a silicon-controlled-rectifier (SCR) having
an anode comprising a P active region over an N well of the P substrate, and
a cathode comprising an N active region over a P well of the P substrate,
the well tap comprises a P well tap over the P well,
the P active region of the anode of the SCR is coupled to the IO pad,
the N active region of the cathode of the SCR corresponds to the emitter of the parasitic BJT of the first ESD protection device, and is coupled to the first power supply voltage terminal, and
the N well corresponds to the collector of the parasitic BJT of the first ESD protection device.

15. An integrated circuit (IC) device, comprising:
a P substrate having a P well;
an electrostatic discharge (ESD) protection device over a first portion of the P well, the ESD protection device comprising:
a plurality of first conductive patterns extending in a first direction and configured to be coupled to an IO pad, and
a plurality of second conductive patterns extending in the first direction and configured to be coupled to a first power supply voltage terminal,
wherein the plurality of first conductive patterns and the plurality of second conductive patterns are arranged alternatingly in a second direction transverse to the first direction;
a plurality of P diodes over a second portion of the P well, wherein
each P diode among the plurality of P diodes is over a corresponding N well in the second portion of the P well, and comprises, over the P substrate, a parasitic PNP bipolar junction transistor (BJT),
the plurality of P diodes comprises a first series of serially coupled P diodes having the corresponding parasitic PNP BJTs coupled to each other in a Darlington configuration,
an emitter of the parasitic PNP BJT of a first P diode in the first series of P diodes is configured to be coupled
to the IO pad, or
to an intermediate node which is coupled to the IO pad via a current limiting resistor, and
a collector of the parasitic PNP BJT of a last P diode in the first series of P diodes is configured to be coupled to the first power supply voltage terminal; and
a P strap over the P well, wherein the P strap comprises a plurality of third conductive patterns extending around the first portion and the second portion of the P well and configured to be coupled to the first power supply voltage terminal.

16. The IC device of claim 15, wherein
the plurality of P diodes further comprises a second series of serially coupled P diodes having the corresponding parasitic PNP BJTs coupled to each other in the Darlington configuration,
an emitter of the parasitic PNP BJT of a first P diode in the second series of P diodes is configured to be coupled
to the IO pad, or
to the intermediate node, and
a collector of the parasitic PNP BJT of a last P diode in the second series of P diodes is configured to be coupled to a second power supply voltage terminal.

17. The IC device of claim 15, wherein
the ESD protection device comprises a drain-extended n-channel metal-oxide semiconductor (DENMOS) transistor having
a drain region corresponding to the plurality of first conductive patterns, and
a source region corresponding to the plurality of second conductive patterns,
the plurality of first conductive patterns and the plurality of second conductive patterns extend across N active regions in the first portion of the P well, and
the N active regions extend in the second direction.

18. The IC device of claim 15, wherein
the ESD protection device comprises a field oxide device (FOD) having N active regions in the first portion of the P well, and
each of the N active regions extends in the first direction and corresponds to
a first conductive pattern among the plurality of first conductive patterns, or
a second conductive pattern among the plurality of second conductive patterns.

19. The IC device of claim 15, wherein
the ESD protection device comprises a silicon-controlled-rectifier (SCR) having
an anode comprising a plurality of P active regions over a plurality of N wells in the first portion of the P well, and
a cathode comprising a plurality of N active regions over the first portion of the P well,
the plurality of P active regions corresponds to the plurality of first conductive patterns,
the plurality of N active regions corresponds to the plurality of second conductive patterns, and
the plurality of N wells, the plurality of P active regions and the plurality of N active regions extend in the first direction.

20. A method of protecting a circuit coupled to an input/output (IO) pad, a ground voltage terminal and a positive voltage terminal, the method comprising:

in response to an electrostatic discharge (ESD) voltage applied to the IO pad in an ESD event,
    causing a trigger current source device, which is formed over a P well of a P substrate of the circuit and coupled to the IO pad either directly or via a current limiting resistor, to become conductive, wherein
    a P well tap over the P well is coupled to the ground voltage terminal,
    an n-channel metal-oxide semiconductor (NMOS) transistor configured as an ESD protection device is formed over the P well and has a parasitic NPN bipolar junction transistor (BJT),
    a source of the NMOS transistor corresponds to an emitter of the parasitic NPN BJT, and is coupled to the ground voltage terminal,
    a drain of the NMOS transistor corresponds to a collector of the parasitic NPN BJT, and is coupled to the IO pad, and
    a gate of the NMOS transistor is coupled to a control circuit, and
    in response to the trigger current source device becoming conductive, discharging the ESD voltage on the IO pad through the ESD protection device to the ground voltage terminal; and
in absence of the ESD voltage on the IO pad, controlling, by the control circuit, the NMOS transistor to operate in cooperation with a p-channel metal-oxide semiconductor (PMOS) transistor as a driver circuit to handle signal transfer between the circuit and the IO pad, the PMOS transistor coupled between the positive voltage terminal and the IO pad.

\* \* \* \* \*